US007728695B2

(12) United States Patent
Sato

(10) Patent No.: US 7,728,695 B2
(45) Date of Patent: Jun. 1, 2010

(54) MULTILAYER FILTER HAVING AN INDUCTOR PORTION AND A VARISTOR PORTION STACKED WITH AN INTERMEDIATE PORTION

(75) Inventor: Takahiro Sato, Tokyo (JP)

(73) Assignee: TDK Corporation, Tokyo (JP)

( * ) Notice: Subject to any disclaimer, the term of this patent is extended or adjusted under 35 U.S.C. 154(b) by 95 days.

(21) Appl. No.: 12/058,133

(22) Filed: Mar. 28, 2008

(65) Prior Publication Data

US 2008/0258840 A1 Oct. 23, 2008

(30) Foreign Application Priority Data

Apr. 19, 2007 (JP) ............................. 2007-110785
Aug. 29, 2007 (JP) ............................. 2007-223047

(51) Int. Cl.
*H03H 7/00* (2006.01)

(52) U.S. Cl. ....................................... 333/185; 333/172

(58) Field of Classification Search ................. 333/172, 333/175, 184, 202, 204; 336/200, 223, 232
See application file for complete search history.

(56) References Cited

U.S. PATENT DOCUMENTS

| | | | | |
|---|---|---|---|---|
| 6,376,085 | B1 | 4/2002 | Oobuchi et al. | |
| 7,085,118 | B2 | 8/2006 | Inoue et al. | |
| 7,253,713 | B2 * | 8/2007 | Tomonari et al. | 336/200 |
| 7,277,270 | B2 | 10/2007 | Sato et al. | |
| 7,283,032 | B2 | 10/2007 | Inoue et al. | |
| 2007/0071986 | A1 * | 3/2007 | Umeda et al. | 428/457 |

FOREIGN PATENT DOCUMENTS

| | | |
|---|---|---|
| JP | A 63-76313 | 4/1988 |
| JP | A 4-284611 | 10/1992 |
| JP | A-5-136001 | 6/1993 |
| JP | A 6-215985 | 8/1994 |
| JP | A-8-31693 | 2/1996 |
| JP | A-9-82568 | 3/1997 |
| JP | B2 2626143 | 4/1997 |
| JP | A-11-243034 | 9/1999 |
| JP | A-2001-297946 | 10/2001 |
| JP | A-2002-118033 | 4/2002 |
| JP | A-2004-311877 | 11/2004 |
| JP | A 2005-50973 | 2/2005 |
| JP | A-2005-260137 | 9/2005 |

(Continued)

OTHER PUBLICATIONS

Notice of Reasons for Rejection issued for Japanese Application No. 2007-223047 on Mar. 3, 2009.

*Primary Examiner*—Robert Pascal
*Assistant Examiner*—Kimberly E Glenn
(74) *Attorney, Agent, or Firm*—Oliff & Berridge, PLC

(57) ABSTRACT

A multilayer filter comprises an inductor stacked-layer portion and a varistor stacked-layer portion. The varistor stacked-layer portion has a varistor layer the main component of which is ZnO and a hot electrode and ground electrode positioned in opposite with the varistor layer intervening, and the region enclosed between the opposing hot electrode and ground electrode does not contain a Cu component. Because the region enclosed between the opposing hot electrode and ground electrode is a region which manifests varistor characteristics, and thus the region does not contain a Cu component, degradation of the attenuation characteristics can be suppressed.

6 Claims, 19 Drawing Sheets

FOREIGN PATENT DOCUMENTS

| | | |
|---|---|---|
| JP | A 2006-86175 | 3/2006 |
| JP | A 2006-114626 | 4/2006 |
| JP | A 2006-156680 | 6/2006 |
| JP | A 2006-245258 | 9/2006 |
| JP | A 2006-351962 | 12/2006 |
| JP | A 2007-91538 | 4/2007 |
| JP | A 2007-91539 | 4/2007 |
| JP | A-2007-96926 | 4/2007 |
| JP | A 2007-195060 | 8/2007 |

* cited by examiner (a)

(b)

(a)

(b)

(a)

(b)

(a)

(b)

MULTILAYER FILTER HAVING AN INDUCTOR PORTION AND A VARISTOR PORTION STACKED WITH AN INTERMEDIATE PORTION

BACKGROUND OF THE INVENTION

1. Field of the Invention

The present invention relates to a multilayer filter.

2. Related Background Art

In recent years, noise filters having surge functions have been used in various electronic equipment as components to alleviate EMC. In Patent Document 1 (See for Japanese Patent Publication No. 2626143), a multilayer composite electronic component is disclosed in which a magnetic layer, in which a prescribed conductor pattern is formed internally, and a varistor layer, in which a prescribed conductor pattern is formed internally, are layered, and the magnetic layer and varistor layer are electrically connected by means of a through-hole.

However, in the above Patent Document 1 the magnetic layer and varistor layer are integrally sintered, and material components comprising the respective layers may diffuse into the other layer through the interface between the magnetic layer and the varistor layer. When diffusion of these material components occurs, the characteristics of the layers in which diffusion occurs are affected, and there are concerns that noise filter functions may be degraded. In the above Patent Document 1, an Ni—Cu—Zn system ferrite is used in the magnetic layer, but studies by these inventors have revealed that when a magnetic layer comprising such a material is integrally sintered with a varistor layer, the Cu component in the magnetic layer diffuses into the varistor layer, permeating into the region which manifests the varistor characteristics, degradation of varistor functions, and in particular of the attenuation characteristic, occurs.

SUMMARY OF THE INVENTION

Hence an object of this invention is to provide a multilayer filter the attenuation characteristic of which is not worsened even when a magnetic layer and a varistor layer are integrally sintered.

A multilayer filter of this invention comprises an inductor portion and a varistor portion; the varistor portion has a varistor layer the main component of which is ZnO, and a plurality of varistor conductor portions arranged in opposition with the varistor layer intervening, and is characterized in that no Cu component is contained in the region enclosed between the opposing varistor conductor portions.

According to this invention, no Cu component is contained in the region enclosed between opposing varistor conductor portions, that is, the region which manifests varistor characteristics. Hence degradation of attenuation characteristics can be suppressed.

In a multilayer filter of this invention, it is preferable that the inductor portion and varistor portion be layered with an intermediate portion intervening, and that the intermediate portion have a composition differing from the compositions of the inductor portion and varistor portion, and not contain a Cu component. By providing an intermediate layer between the inductor portion and varistor portion, of composition different from these, the effect of the varistor portion on the inductor portion, and the effect of the varistor portion on the inductor portion, can be alleviated. Further, the intermediate layer does not contain a Cu component, so that the possibility that a Cu component may diffuse into the varistor portion is extremely small, and degradation of the attenuation characteristic can be reliably suppressed.

In a multilayer filter of this invention, it is preferable that the inductor portion have an inductor layer and an inductor conductor portion formed in the inductor layer, that the inductor layer be formed from any one among an Ni—Zn system ferrite, Ni—Zn—Mg system ferrite, and a Zn system ferrite, and that the inductor layer not contain a Cu component. The inductor layer does not contain a Cu component, and so the possibility that a Cu component may diffuse into the varistor layer is further reduced. Hence degradation of the attenuation characteristics can be reliably suppressed. Further, when the inductor layer is formed from an Ni—Zn system ferrite and an Ni—Zn—Mg system ferrite in particular, the layer has a high inductance value, so that the multilayer filter can have excellent filter characteristics.

In a multilayer filter of this invention, it is preferable that the inductor portion be a common-mode choke coil, having a sintered member and a plurality of coil conductors arranged within the sintered member. In this case, the multilayer electronic component is further provided with a common-mode choke coil function, and so a multilayer filter with improved filter characteristics in high-frequency bands can be provided.

Further, in a multilayer filter of this invention, it is preferable that each coil conductor comprise a plurality of conductor patterns arranged in a first direction, that a first sintered member have a first layer enclosed between the conductor patterns in the first direction and a second layer enclosed between a plurality of coil conductors in the first direction, that the first layer comprise a nonmagnetic material, and that the second layer comprise a magnetic material. In this case, a second layer comprising a magnetic material is layered on both sides of the first layer enclosed between conductor patterns and comprising a nonmagnetic material, so that the frequency band in which high inductance values for coil conductors can be secured can be extended to comparatively high frequencies. Hence a multilayer filter with still more excellent filter characteristics can be provided.

Further, in a multilayer filter of this invention, it is preferable that each coil conductor comprise a plurality of conductor patterns arranged in a first direction, that a first sintered member have a first layer enclosed between conductor patterns in the first direction and a second layer enclosing a plurality of coil conductors in the first direction, and that the first and second layers comprise a magnetic material. In this case, second layers comprising magnetic material are again layered on both sides of the first layer enclosed between conductor patterns and comprising a magnetic material, so that compared with a device in which the first layer comprises a nonmagnetic material and the second layer comprises a magnetic material, the inductance value of coil conductors in low-frequency bands can be made still higher. Hence a multilayer filter with still more excellent filter characteristics can be provided.

Further, in a multilayer filter of this invention, it is preferable that each coil conductor comprise a plurality of conductor patterns arranged in a first direction, that a first sintered member have a first layer enclosed between conductor patterns in a first direction and a second layer enclosing a plurality of coil conductors in the first direction, and that the first and second layers comprise a nonmagnetic material. In this case, second layers comprising a nonmagnetic material are again layered on both sides of a first layer enclosed between conductor patterns and comprising a nonmagnetic material, so that compared with a device in which the first layer comprises a nonmagnetic material and the second layer comprises a magnetic material, the frequency band in which a high inductance value for coil conductors can be secured can be extended to still higher frequencies. Hence a multilayer filter with more excellent filter characteristics can be provided.

By means of this invention, a multilayer filter can be provided with no degradation of attenuation characteristics even when a magnetic layer and a varistor layer are integrally sintered.

The present invention will become more fully understood from the detailed description given below and the accompanying drawings, which are given by way of illustration only, and thus are not to be considered as limiting the present invention.

The scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent from this detailed description to those skilled in the art.

DESCRIPTION OF THE PREFERRED EMBODIMENTS

Below, preferred embodiments of the invention are explained in detail referring to the attached drawings. In these explanations, the same symbols are used for elements which are the same or which have the same functions, and redundant explanations are omitted.

First Embodiment

Figure 1:
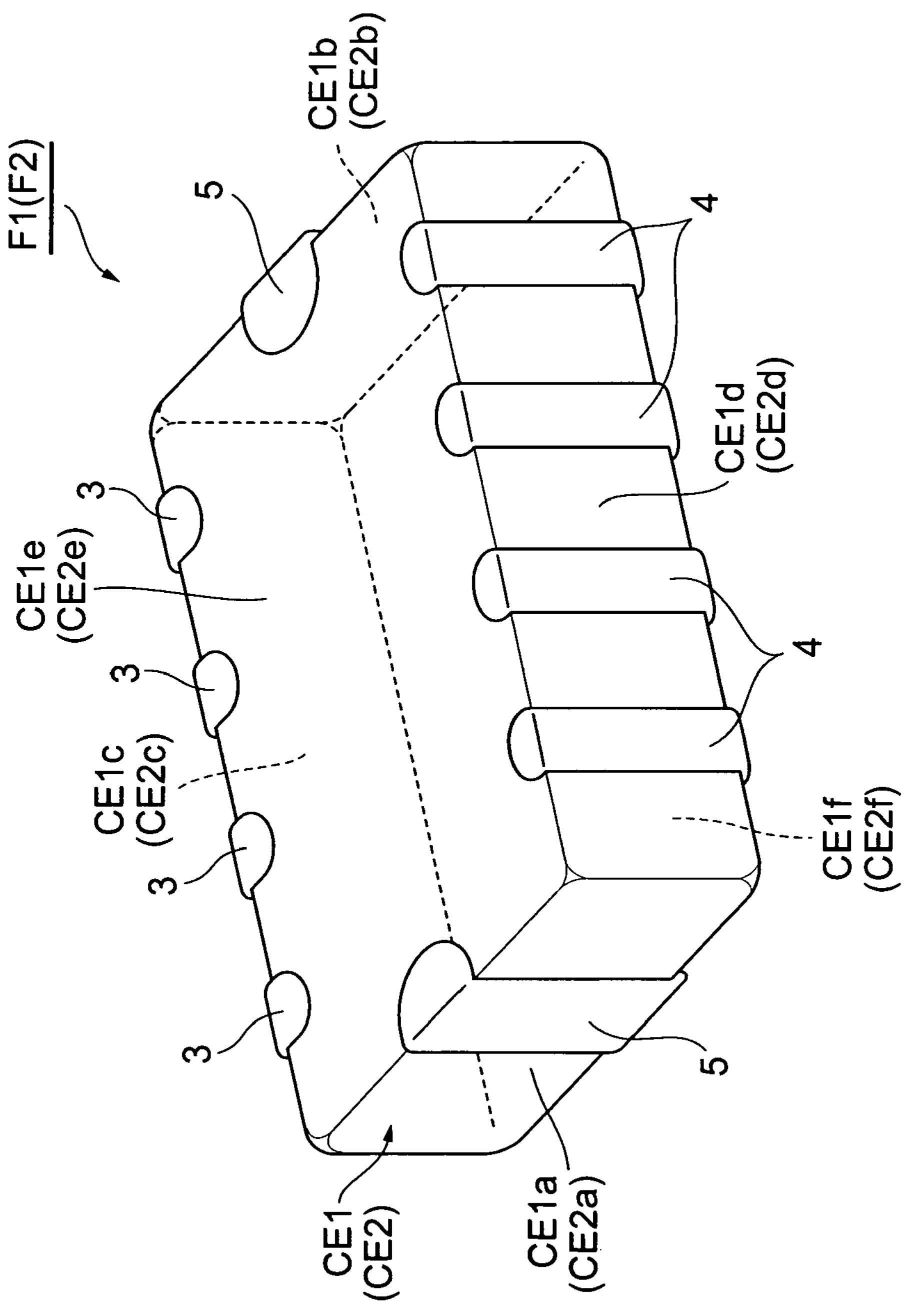
FIG. 1 is a schematic perspective view showing the multilayer filter of a first embodiment.
Figure 2:
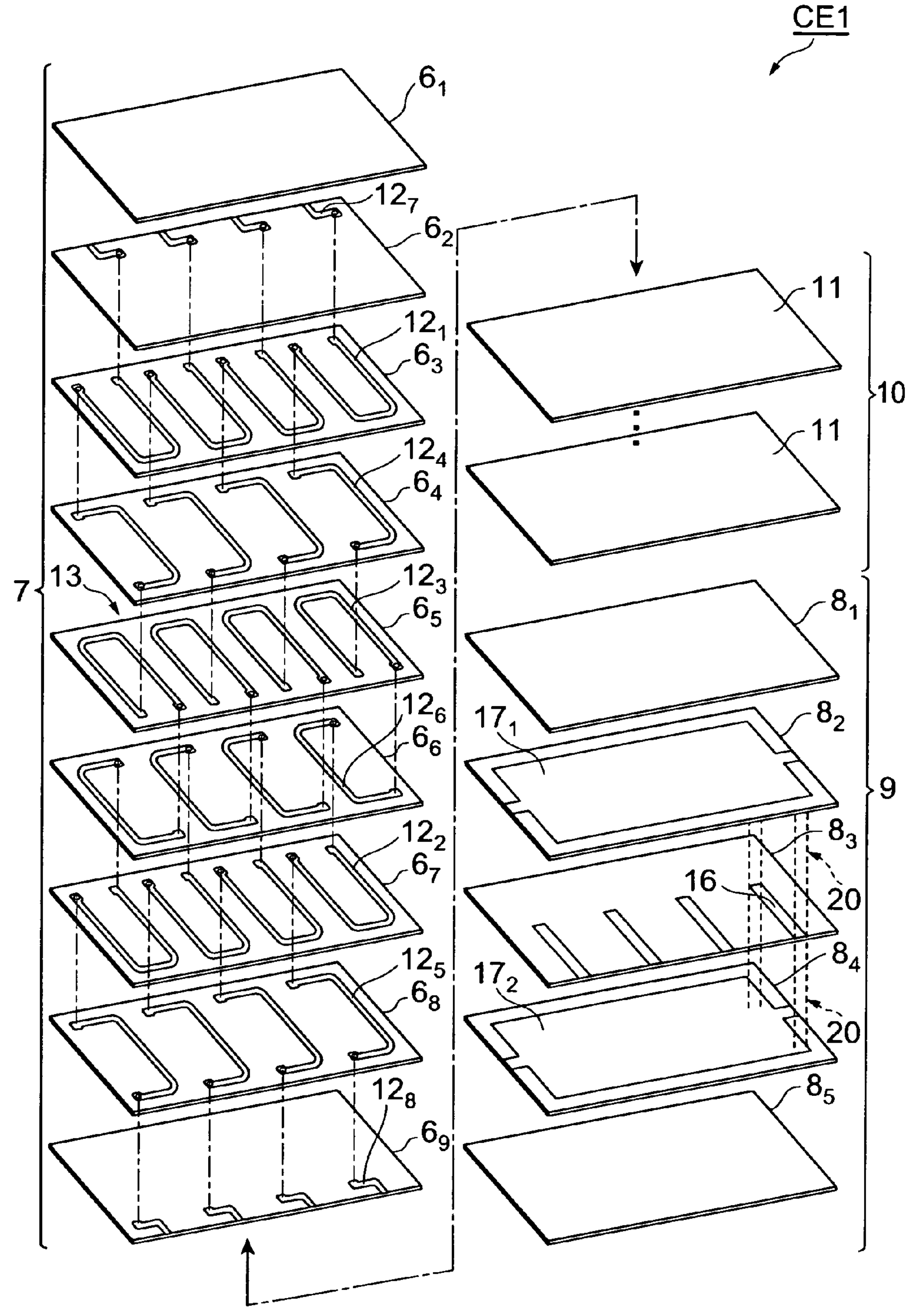
FIG. 2 is an exploded perspective view showing the multilayer body of the multilayer filter of the first embodiment.
Figure 3:
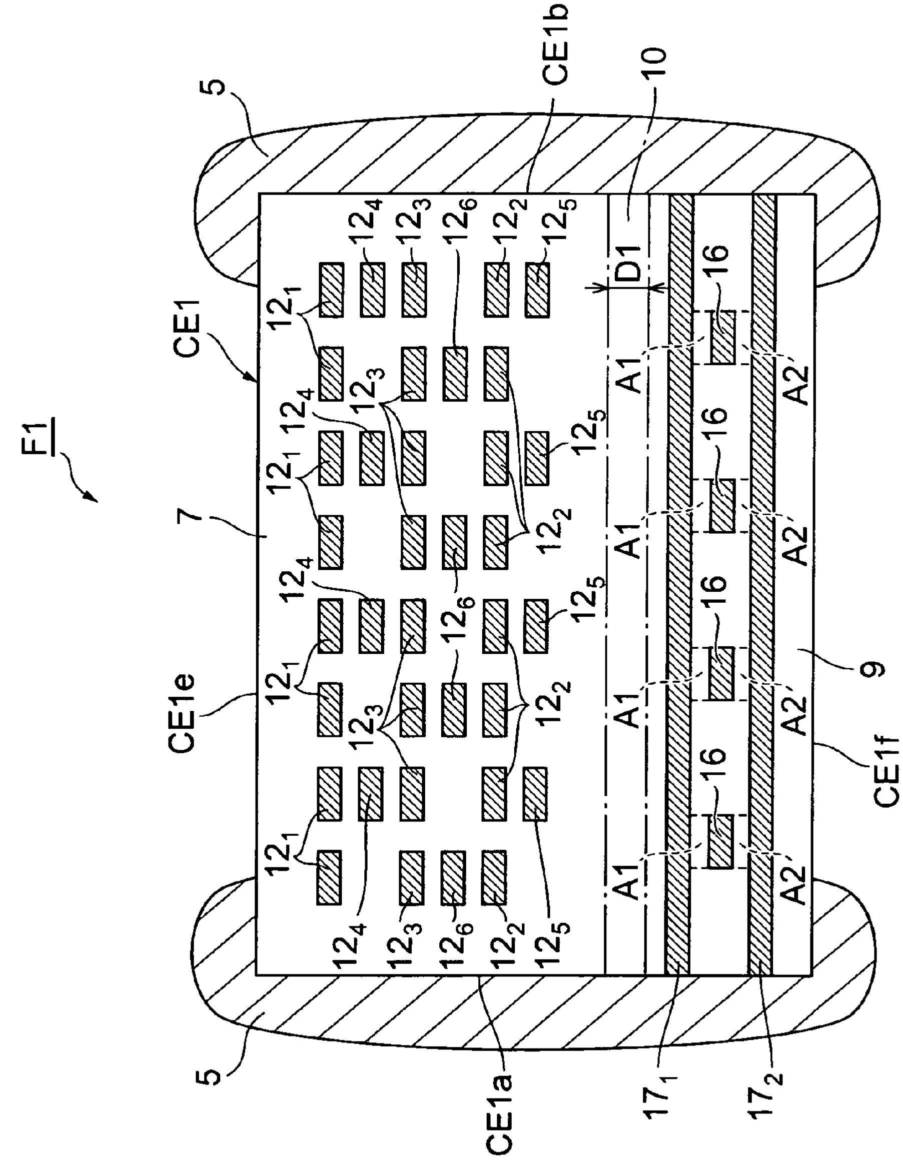
FIG. 3 is a cross-sectional view showing the central cross-section of the multilayer filter of the first embodiment.
Figure 4:
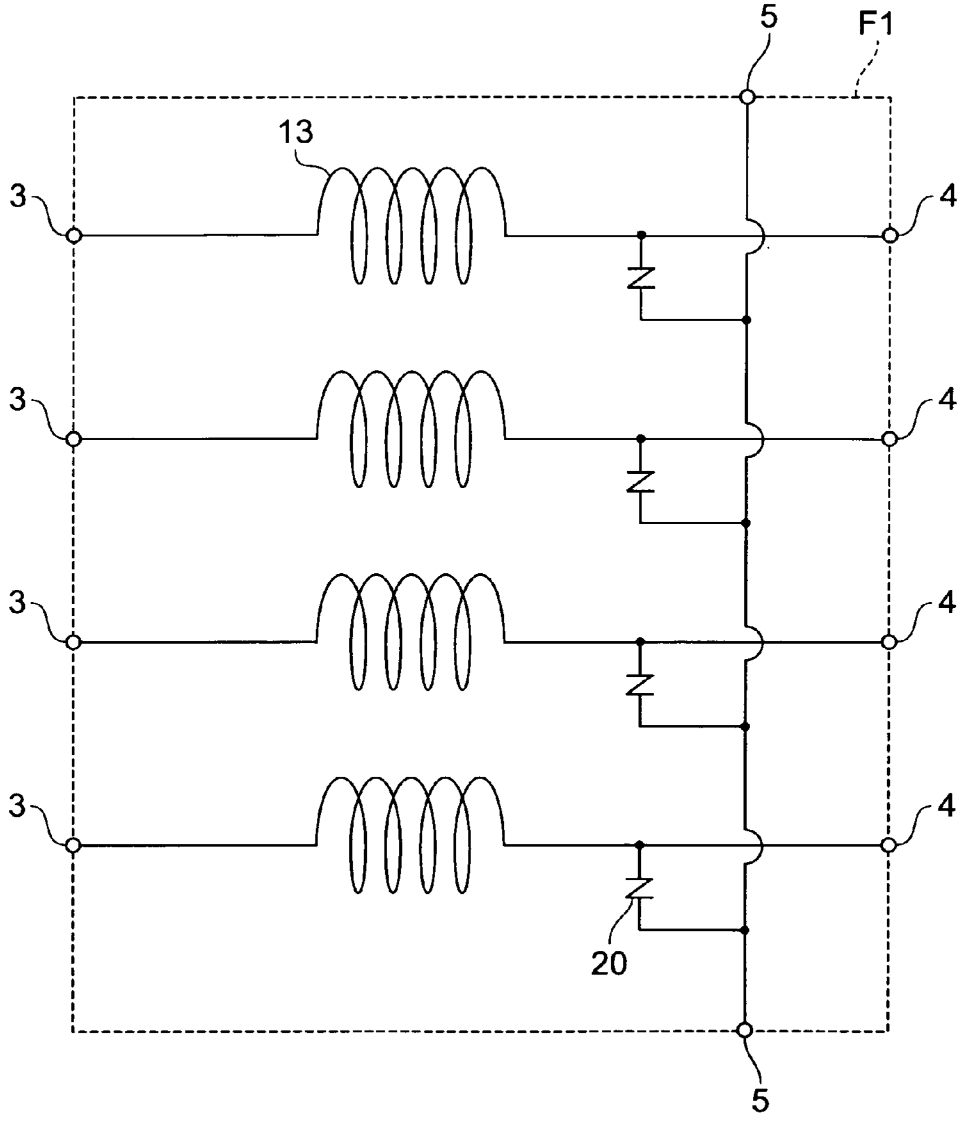
FIG. 4 is an equivalent circuit diagram of the multilayer filter of the first embodiment.

FIG. 1 is a schematic perspective view showing the multilayer filter of a first embodiment, and FIG. 2 is an exploded perspective view showing the multilayer body of the multilayer filter of the first embodiment. FIG. 3 is a cross-sectional view showing the central cross-section of the multilayer filter of the first embodiment, and FIG. 4 is an equivalent circuit diagram of the multilayer filter of the first embodiment. The cross-section in FIG. 3 is in a plane parallel to the multilayer body length direction and the layer-stacking direction. Also, FIG. 1 combines a perspective view of the multilayer filter of a second embodiment, described below.

The multilayer filter F1 shown in FIG. 1 is a multilayer filter array component, and as shown in FIG. 4, is provided with four L-shape filter elements in a row, each comprising an inductor 13 and varistor 20. The multilayer filter F1 comprises a multilayer body CE1, with substantially a rectangular parallelepiped shape; four input terminal electrodes 3; four output terminal electrodes 4; and a pair of ground terminal electrodes 5.

The multilayer body CE1 has first and second end faces CE1*a*, CE1*b*; first and second side faces CE1*c*, CE1*d*; and first and second main faces CE1*e*, CE1*f*. The first and second main faces CE1*e*, CE1*f* have a rectangular shape, and are mutually opposing. The first and second end faces CE1*a*, CE1*b* extend in the short-edge direction of the first and second main faces CE1*e*, CE1*f* so as to connect the first and second main faces CE3*e*, CE3*f*, and are mutually opposed. The first and second side faces CE1*c*, CE1*d* extend in the long-edge direction of the first and second main faces CE1*e*, CE1*f* so as to connect the first and second main faces CE1*e*, CE1*f*, and are mutually opposed.

The four input terminal electrodes 3 are provided in order on the first side face CE1*c* of the multilayer body CE1, forming a shape extending in the layer-stacking direction of the multilayer body CE1. Similarly, the four output terminal electrodes 4 are provided in order on the second side face CE1*d* of the multilayer body CE1, forming a shape extending in the layer-stacking direction of the multilayer body CE1. The input terminal electrodes 3 and output terminal electrodes 4 are provided so as to be mutually opposed.

Of the pair of ground terminal electrodes 5, one is positioned in the center portion of the first end face CE1*a* of the multilayer body CE1, forming a shape extending in the layer-stacking direction of the multilayer body CE1. Of the pair of ground terminal electrodes 5, the other is positioned in the center portion of the second end face CE1*b* of the multilayer body CE1, forming a shape extending in the layer-stacking direction of the multilayer body CE1. The pair of ground terminal electrodes 5 are provided so as to be mutually opposed.

The multilayer body CE1 is explained in detail. As shown in FIG. 2 and FIG. 3, the multilayer body CE1 comprises an inductor stacked-layer portion (inductor portion) 7, formed by stacking inductor layers $\mathbf{6}_1$ to $\mathbf{6}_9$; a varistor stacked-layer portion (varistor portion) 9, formed by stacking varistor layers $\mathbf{8}_1$ to $\mathbf{8}_5$; and an intermediate stacked-layer portion (intermediate portion) 10, formed by stacking a plurality of intermediate layers 11. The inductor stacked-layer portion 7 and varistor stacked-layer portion 9 are stacked with the intermediate stacked-layer portion 10 intervening.

The inductor layers $6_1$ to $6_9$ have the shape of thin rectangles, and comprise a ferrite material. As the ferrite material, any one among an Ni—Zn system ferrite, an Ni—Zn—Mg system ferrite, or a Zn system ferrite is used. In particular, when an Ni—Zn system ferrite or an Ni—Zn—Mg system ferrite is used, a high inductance value is obtained, so that the filter characteristics are superior. The inductor layers $6_1$ to $6_9$ may contain a Cu component.

The varistor layers $8_1$ to $8_5$ have the shape of thin rectangles, and comprise a ceramic material the main component of which is ZnO. This ceramic material may comprise, as added components, Pr, Bi, Co, Al, or similar. When Co is comprised in addition to Pr, excellent varistor characteristics are obtained, and a high permittivity ($\epsilon$) results as well. Further, when Al is comprised, the resistivity is low. Other additives, such as for example Cr, Ca, Si, K, and other elements, may also be comprised as necessary. However, the varistor layers $8_1$ to $8_5$ do not contain a Cu component.

On the inductor layers $6_2$ to $6_9$ are formed inductor conductor portions $12_1$ to $12_8$ respectively, comprising a material containing Ag and Pd. Of the inductor conductor portions $12_1$ to $12_8$, the inductor conductor portions $12_7$ and $12_8$ are provided as terminal electrode leaders, and the inductor conductor portions $12_1$ to $12_6$ are formed in coil shapes in order to increase the inductance value.

More specifically, on each of the inductor layers $6_3$ and $6_7$ are formed four inductor conductor portions $12_1$ and $12_2$, having a U-shape along the first and second end faces CE1*a* and CE1*b* and the second side face CE1*d* of the multilayer body CE1. On the inductor layer $6_5$ are formed four inductor conductor portions $12_3$, having a U-shape along the first and second end faces CE1*a*, CE1*b* and the first side face CE1*c* of the multilayer body CE1. On each of the inductor layers $6_4$ and $6_8$ are formed four inductor conductor portions $12_4$ and $12_5$, having a U-shape along the second end face CE1*b* and the first and second side faces CE1*c*, CE1*d* of the multilayer body CE1. On the inductor layer $6_6$ are formed four inductor conductor portions $12_6$, having a U-shape along the first end face CE1*a* and the first and second side faces CE1*c*, CE1*d* of the multilayer body CE1. On the inductor layer $6_2$ are formed four inductor conductor portions $12_7$, and on the inductor layer $6_9$ are formed four inductor conductor portions $12_8$.

One end of each of the four inductor conductor portions $12_7$ leads out to the first side face CE1*c* of the multilayer body CE1, these ends are connected to the respective four input terminal electrodes 3. The other end of each of the four inductor conductor portions $12_7$ is connected to one end of each of four inductor conductor portions $12_1$ via through-holes, and the other end of each of the four inductor conductor portions $12_1$ is connected to one end of each of four inductor conductor portions $12_4$ via through-holes The other ends of the four inductor conductor portions $12_4$ are connected via through-holes to one end of each of the four inductor conductor portions $12_3$, and the other ends of the four inductor conductor portions $12_3$ are connected via through-holes to one end of each of the four inductor conductor portions $12_6$. The other ends of the four inductor conductor portions $12_6$ are connected via through-holes to one end of each of the four inductor conductor portions $12_2$, and the other ends of the four inductor conductor portions $12_2$ are connected via through-holes to one end of each of the four inductor conductor portions $12_5$. The other ends of the four inductor conductor portions $12_5$ are connected via through-holes to one end of each of the four inductor conductor portions $12_8$, and the other ends of the four inductor conductor portions $12_8$ are led out to the second side face CE1*d* of the multilayer body CE1, and connected to the respective four output terminal electrodes 4. In this way, the inductor conductor portions $12_1$ to $12_8$ are electrically connected, to form the four inductors 13 shown in FIG. 3.

Four hot electrodes (varistor conductor portions) 16 and ground electrodes (varistor conductor portions) $17_1$ and $17_2$ are arranged between the varistor layers $8_1$ to $8_5$, so as to be opposed in the direction of layer stacking of the varistor layers $8_1$ to $8_5$. The hot electrodes 16 and ground electrodes $17_1$ and $17_2$ comprise material containing Ag and Pd.

More specifically, four hot electrodes 16 are formed on the varistor layer $8_3$, in substantially a strip shape extending along the first and second end faces CE1*a* and CE1*b* of the multilayer body CE1. One end of each of the four hot electrodes 16 is led out to the second side face CE1*d* of the multilayer body CE1, and these are connected to the four output terminal electrodes 4 respectively. That is, one end of each of the four hot electrodes 16 is connected to the other end of the respective different four inductor conductor portions $12_8$. On the varistor layers $8_2$ and $8_5$ are formed ground electrodes $17_1$ and $17_2$ respectively, having expanded-width portions in the center. One end of each of the ground electrodes $17_1$ and $17_2$ is led out to the first end face CE1*a* of the multilayer body CE1, and connected to the ground terminal electrode 5 positioned on the first end face CE1*a*. The other ends of the ground electrodes $17_1$ and $17_2$ are led out to the second end face CE1*b* of the multilayer body CE1, and connected to the ground terminal electrode 5 positioned on the second end face CE1*b*.

Seen from the layer-stacking direction of the varistor layers $8_1$ to $8_5$, the four hot electrodes 16 and the expanded-width portions of the ground electrodes $17_1$ and $17_2$ partially overlap, with the varistor layers $8_2$ and $8_3$ intervening, and are opposed. The four varistors 20 shown in FIG. 3 are formed by means of the four hot electrodes 16 and ground electrodes $17_1$ and $17_2$ positioned in this way.

The intermediate layers 11 of the intermediate stacked-layer portion 10 are thin and rectangular in shape, and have a composition different from those of the inductor layers $6_1$ to $6_9$ and varistor layers $8_1$ to $8_5$. More specifically, the intermediate layers 11 comprising an insulating material having electrically insulating properties; as such insulating material, for example, material the main component of which is ZnO or $Fe_2O_3$ is used. By providing intermediate layers 11 of such material between the inductor stacked-layer portion 7 and the varistor stacked-layer portion 9, crosstalk therebetween can be suppressed, and consequently the influence of the inductor stacked-layer portion 7 on the varistor stacked-layer portion 9, and the influence of the varistor stacked-layer portion 9 on the inductor stacked-layer portion 7, can be alleviated. The intermediate layers 11 do not contain a Cu component.

Next, a method of manufacture of the above-described multilayer filter F1 is explained.

First, inductor green sheets, to serve as inductor layers $6_1$ to $6_9$, are prepared. These inductor green sheets are formed by using the doctor blade method to apply a slurry, the starting material of which is for example an Ni—Zn system ferrite, Ni—Zn—Mg system ferrite, or Zn system ferrite, onto a film form to a thickness of for example approximately 20 μm.

Further, varistor green sheets to serve as varistor layers $8_1$ to $8_5$ are prepared. These varistor green sheets are formed by using the doctor blade method to apply a slurry, the starting material of which is a mixed powder of for example ZnO, $Pr_6O_{11}$, CoO, $Cr_2O_3$, $CaCO_3$, $SiO_2$, $K_2CO_3$, and $Al_2O_3$, onto a film. The slurry does not contain a Cu component.

Further, intermediate member green sheets to serve as intermediate layers 11 are prepared. The intermediate member green sheets are insulating members having electrically insulating properties, and are formed by using the doctor blade method to apply a slurry, the starting material of which is a powder mixture the main component of which is ZnO and $Fe_2O_3$, onto a film. The thickness of the intermediate member green sheets 2 is for example 30 μm. The number of intermediate member green sheets is adjusted as appropriate such that the thickness D1 of the intermediate stacked-layer portion 10 after firing is adequate. More specifically, it is preferable that the number of intermediate member green sheets be adjusted such that the thickness D1 of the intermediate stacked-layer portion 10 after firing be 60 μm or greater. In order to adjust the rate of shrinkage of the intermediate member green sheets, it is preferable that a powder mixture of one or more type among NiO, CoO, $Pr_6O_{11}$, $CaCO_3$, and $SiO_2$ be added. The slurry does not contain a Cu component.

Next, laser machining or another method is used to form through-holes at prescribed positions in the inductor green sheets which are to serve as the inductor layers $\mathbf{6}_2$ to $\mathbf{6}_8$ (that is, positions at which through-holes are to be formed in the inductor conductor portions $\mathbf{12}_1$ to $\mathbf{12}_7$).

Next, conductor patterns corresponding to the inductor conductor portions $\mathbf{12}_1$ to $\mathbf{12}_8$ are formed on the inductor green sheets serving as the inductor layers $\mathbf{6}_2$ to $\mathbf{6}_9$. These conductor patterns are formed by screen printing of a conductive paste, the main components of which are Ag and Pd, onto the inductor green sheets. Also, the interiors of the through-holes formed in the inductor green sheets serving as the inductor layers $\mathbf{6}_2$ to $\mathbf{6}_8$ are filled with conductive paste by screen printing of the conductive paste onto the inductor green sheets.

Conductor patterns corresponding to the hot electrodes 16 and ground electrodes $\mathbf{17}_1$ and $\mathbf{17}_2$ are then formed on the varistor green sheets serving as the varistor layers $\mathbf{8}_2$ to $\mathbf{8}_4$. These conductor patterns are formed by screen printing of a conductive paste, the main components of which are Ag and Pd, onto the varistor green sheets.

Next, the inductor green sheets which are to become inductor layers $\mathbf{6}_1$ to $\mathbf{6}_9$, the intermediate member green sheets which are to become intermediate layers 11, and the varistor green sheets which are to become varistor layers $\mathbf{8}_1$ to $\mathbf{8}_5$ are stacked in a prescribed order and contact-bonded, and cut into chip units. Then, firing is performed at a prescribed temperature (for example, approximately 1100 to 1200° C.), to obtain a multilayer body CE1 in which the inductor stacked-layer portion 7 and varistor stacked-layer portion 9 are stacked with an intermediate stacked-layer portion 10 intervening.

Next, a conductive paste the main component of which is Ag is transferred onto positions on the outer surface of the multilayer body CE1 corresponding to the four input terminal electrodes 3, four output terminal electrodes 4, and ground terminal electrodes 5, and baking is performed at a prescribed temperature (for example, 700 to 800° C.), after which electroplating is performed using Ni/Sn, Cu/Ni/Sn, Ni/Au, Ni/Pd/Au, Ni/Pd/Ag, or Ni/Ag. By this means, the terminal electrodes 3 to 5 are formed.

By means of the above processes, a multilayer filter F1 is completed.

When stacking the various green sheets and performing firing, if Cu diffuses in the regions A1 and A2 enclosed between the hot electrodes 16 and ground electrodes $\mathbf{17}_1$ and $\mathbf{17}_2$, the manufactured multilayer filter may not have the desired high-frequency characteristics (that is, the attenuation characteristics may be worsened).

Hence in the multilayer filter F1 of this embodiment, the varistor green sheets are formed from a slurry not containing a Cu component. In this case, no Cu component is contained in the regions A1 and A2 prior to firing. Further, a slurry not containing a Cu component is used to form the intermediate member green sheets adjacent to the varistor green sheets. In this case, there is no diffusion of a Cu component in the intermediate member green sheets into the regions A1 and A2.

Further, in the multilayer filter F1 of this embodiment the thickness D1 of the intermediate stacked-layer portion 10 is made sufficient by stacking a plurality of intermediate member green sheets. The intermediate stacked-layer portion 10 is positioned between the inductor layers $\mathbf{6}_1$ to $\mathbf{6}_9$ and the varistor layers $\mathbf{8}_1$ to $\mathbf{8}_5$, so that even if the inductor green sheets were to contain a Cu component, diffusion of this Cu component would be halted by the thickness of stacked intermediate member green sheets.

In this embodiment, not only are the varistor layers $\mathbf{8}_1$ to $\mathbf{8}_5$ formed from a slurry not containing a Cu component, but the intermediate member green sheets are also formed from a slurry not containing a Cu component, and moreover the intermediate member green sheets are made sufficiently thick so that the possibility of diffusion of a Cu component into the varistor layers $\mathbf{8}_1$ to $\mathbf{8}_5$ during firing is suppressed. Hence varistor layers $\mathbf{8}_1$ to $\mathbf{8}_5$ can be obtained which have an extremely low probability of containing a Cu component.

The regions A1 and A2 enclosed between the hot electrodes 16 and the ground electrodes $\mathbf{17}_1$ and $\mathbf{17}_2$ are regions which manifest varistor characteristics. The regions A1 and A2 comprise varistor layers $\mathbf{8}_2$ and $\mathbf{8}_3$, and the varistor layers $\mathbf{8}_2$ and $\mathbf{8}_3$ have a very low probability of containing a Cu component, for the reasons explained above, so that the inductor layers $\mathbf{6}_1$ to $\mathbf{6}_9$ and varistor layers $\mathbf{8}_2$ and $\mathbf{8}_3$ can be integrally sintered to obtain a multilayer filter F1 in which degradation of attenuation characteristics has been suppressed. Further, the intermediate stacked-layer portions 10 have sufficient thickness and moreover comprise an insulating material, so that crosstalk between the inductor stacked-layer portion 7 and the varistor stacked-layer portion 9 can be adequately prevented.

As shown in FIG. 3, the regions A1 enclosed between the hot electrodes 16 and ground electrodes $\mathbf{17}_1$ are regions which, when seen from the layer-stacking direction of the multilayer body CE1, overlap with the hot electrodes 16 and ground electrodes $\mathbf{17}_1$. The regions A2 enclosed between the hot electrodes 16 and ground electrodes $\mathbf{17}_2$ are regions which, when seen from the layer-stacking direction of the multilayer body CE1, overlap with the hot electrodes 16 and ground electrodes $\mathbf{17}_2$. Further, the varistor layer $\mathbf{8}_2$, when seen from the layer-stacking direction of the multilayer body CE1, comprises regions A1, in which the hot electrodes 16 and ground electrodes $\mathbf{17}_1$ overlap, and regions other than this, which are regions in which the hot electrodes 16 and ground electrodes $\mathbf{17}_1$ do not overlap. And the varistor layer $\mathbf{8}_3$, when seen from the layer-stacking direction of the multilayer body CE1, comprises regions A2, in which the hot electrodes 16 and ground electrodes $\mathbf{17}_2$ overlap, and regions other than this, which are regions in which the hot electrodes 16 and ground electrodes $\mathbf{17}_2$ do not overlap.

In the above, a multilayer filter F1 and a method of manufacture of such a filter were explained as a preferred embodiment; however, this invention is not limited to the above-described embodiment, and various modifications are possible.

For example, in the first embodiment, the inductor layers $\mathbf{6}_1$ to $\mathbf{6}_9$ may contain a Cu component, but the inductor layers $\mathbf{6}_1$ to $\mathbf{6}_9$ may be formed so as not contain a Cu component. As a result, there is no longer diffusion of a Cu component from the inductor layers, so that the probability of diffusion of a Cu component into the varistor layers is further reduced. Hence the degradation of attenuation characteristics can be reliably suppressed. In this case, the multilayer filter needs not comprise an intermediate stacked-layer portion.

Second Embodiment

Figure 5:
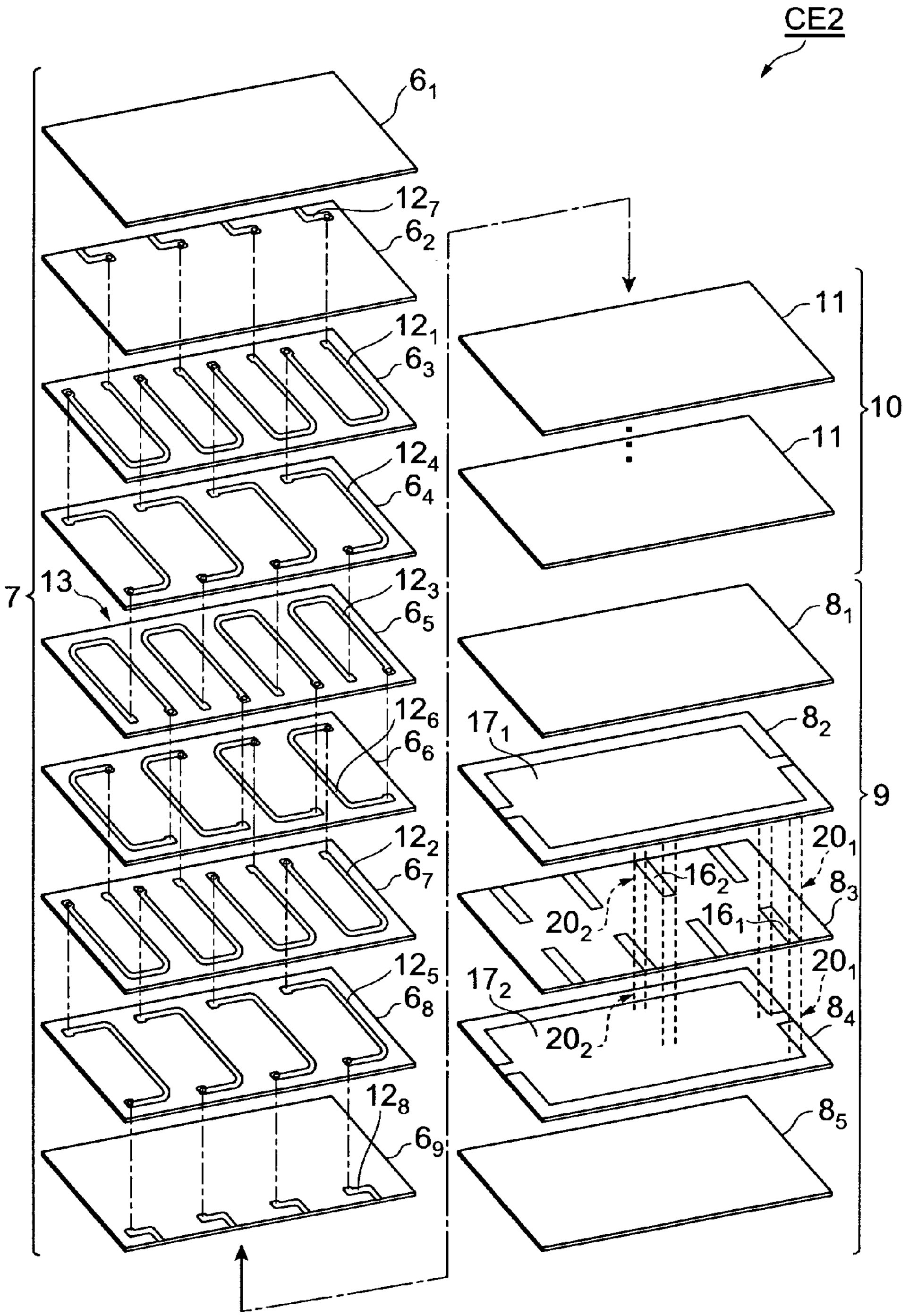
FIG. 5 is an exploded perspective view showing the multilayer body of the multilayer filter of a second embodiment.
Figure 6:
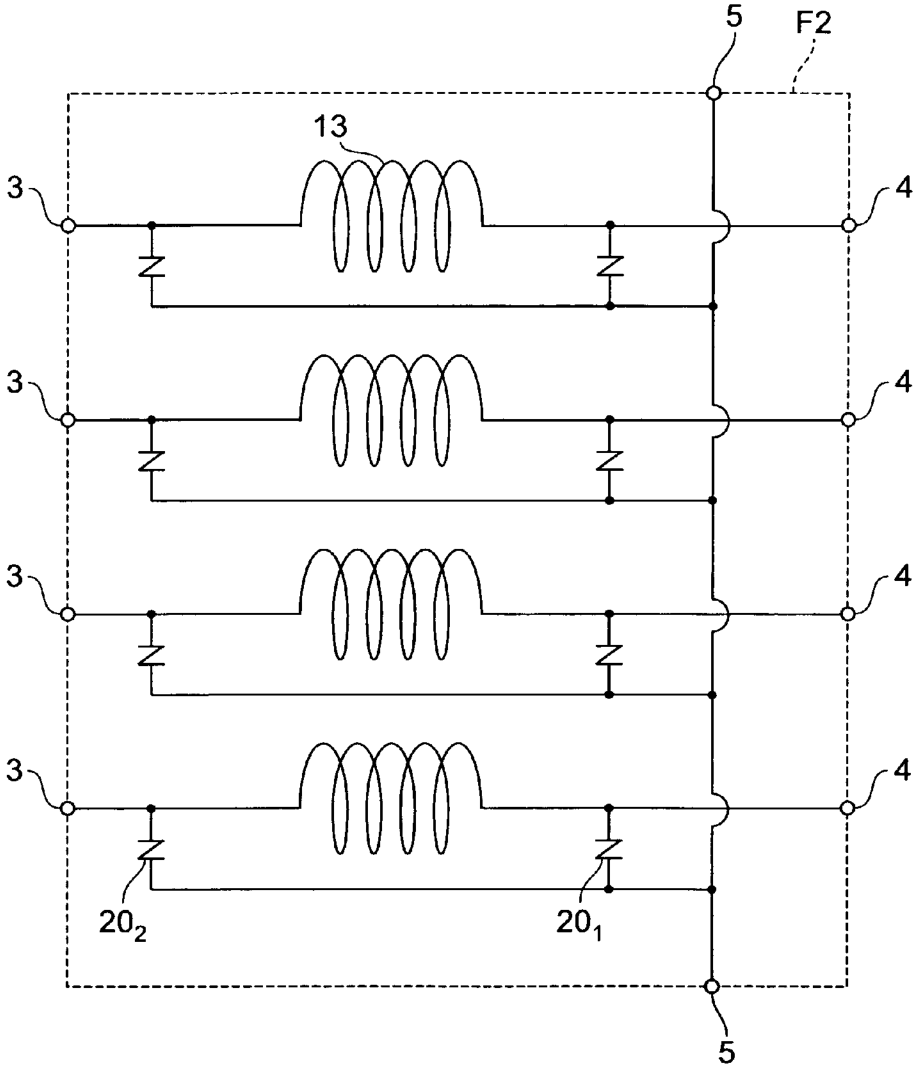
FIG. 6 is an equivalent circuit diagram of the multilayer filter of the second embodiment.

FIG. 5 is an exploded perspective view showing the multilayer filter of a second embodiment, and FIG. 6 is an equivalent circuit diagram of the multilayer filter of the second embodiment. As shown in FIG. 6, the multilayer filter F2 of the second embodiment is provided with four Π-type filter elements, each comprising an inductor 13 and varistors $\mathbf{20}_1$ and $\mathbf{20}_2$, arranged in a row. The multilayer filter F2 of the second embodiment has a multilayer body CE2 differing in configuration from that of the multilayer body CE1 of the multilayer filter F1 of the first embodiment. More specifically, the configuration of the varistor stacked-layer portion 9 of the multilayer body CE2 differs in part from that in the multilayer body CE1.

That is, the multilayer body CE2 has first and second end faces CE2*a* and CE2*b*, first and second side faces CE2*c* and CE2*d*, and first and second main faces CE2*e* and CE2*f*, and these faces are similar to the first and second end faces CE1*a* and CE1*b*, the first and second side faces CE1*c* and CE1*d*, and the first and second main faces CE1*e* and CE1*f* of the multilayer body CE1.

Further, the multilayer body CE2 has an inductor stacked-layer portion 7, a varistor stacked-layer portion 9, and an intermediate stacked-layer portion 10. Of these, the inductor stacked-layer portion 7 and intermediate stacked-layer portion 10 have the same configuration as the inductor stacked-layer portion 7 and intermediate stacked-layer portion 10 of the multilayer body CE1. The varistor stacked-layer portion 9 comprises a plurality of varistor layers $\mathbf{8}_2$, $\mathbf{8}_3$, $\mathbf{8}_4$, stacked in order between the varistor layer $\mathbf{8}_1$ and the varistor layer $\mathbf{8}_5$. The configuration of the varistor layers $\mathbf{8}_1$, $\mathbf{8}_2$, $\mathbf{8}_4$, $\mathbf{8}_5$ is the same as that of the varistor layers $\mathbf{8}_1$, $\mathbf{8}_2$, $\mathbf{8}_4$, $\mathbf{8}_5$ of the multilayer body CE1, while the configuration of the varistor layer $\mathbf{8}_3$ differs from that in the multilayer body CE1.

On the varistor layer $\mathbf{8}_3$ are formed four hot electrodes $\mathbf{16}_1$ and $\mathbf{16}_2$, in substantial strip shapes extending along the first and second end faces CE2*a* and CE2*b* of the multilayer body CE2. One end of each of the four hot electrodes $\mathbf{16}_1$ leads out to the first side face CE2*c* of the multilayer body CE2, and these are connected to one end of the four respective input terminal electrodes 3. That is, one end of each of the four hot electrodes $\mathbf{16}_1$ is connected to the other ends of four different inductor conductor portions $\mathbf{12}_7$. The four hot electrodes $\mathbf{16}_2$ are positioned opposing the previous four hot electrodes $\mathbf{16}_1$. Further, one end of each of the four hot electrodes $\mathbf{16}_2$ leads out to the second side face CE2*d* of the multilayer body CE2, and these are connected to the four respective output terminal electrodes 4. That is, one end of the four hot electrodes $\mathbf{16}_2$ is connected to the other ends of four different inductor conductor portions $\mathbf{12}_8$. The hot electrodes $\mathbf{16}_1$ and hot electrodes $\mathbf{16}_2$ are positioned such that the other ends are a distance apart from each other.

In a varistor stacked-layer portion 9 configured as above, by enclosing the varistor layers $\mathbf{8}_2$ and $\mathbf{8}_3$ between the ground electrodes $\mathbf{17}_1$ and $\mathbf{17}_2$ and the four hot electrodes $\mathbf{16}_1$, four varistors $\mathbf{20}_1$ are formed. Further, by enclosing the varistor layers $\mathbf{8}_2$ and $\mathbf{8}_3$ between the ground electrodes $\mathbf{17}_1$ and $\mathbf{17}_2$ and the four hot electrodes $\mathbf{16}_2$, four varistors $\mathbf{20}_2$ are formed.

In a multilayer filter F2 configured as described above also, varistor layers $\mathbf{8}_2$ and $\mathbf{8}_3$ are positioned in the regions between the hot electrodes $\mathbf{16}_1$ and $\mathbf{16}_2$ and the ground electrodes $\mathbf{17}_1$ and $\mathbf{17}_2$, and because the probability that the varistor layers $\mathbf{8}_2$ and $\mathbf{8}_3$ contain a Cu component is extremely low, degradation of attenuation characteristics can be suppressed.

Figure 7:
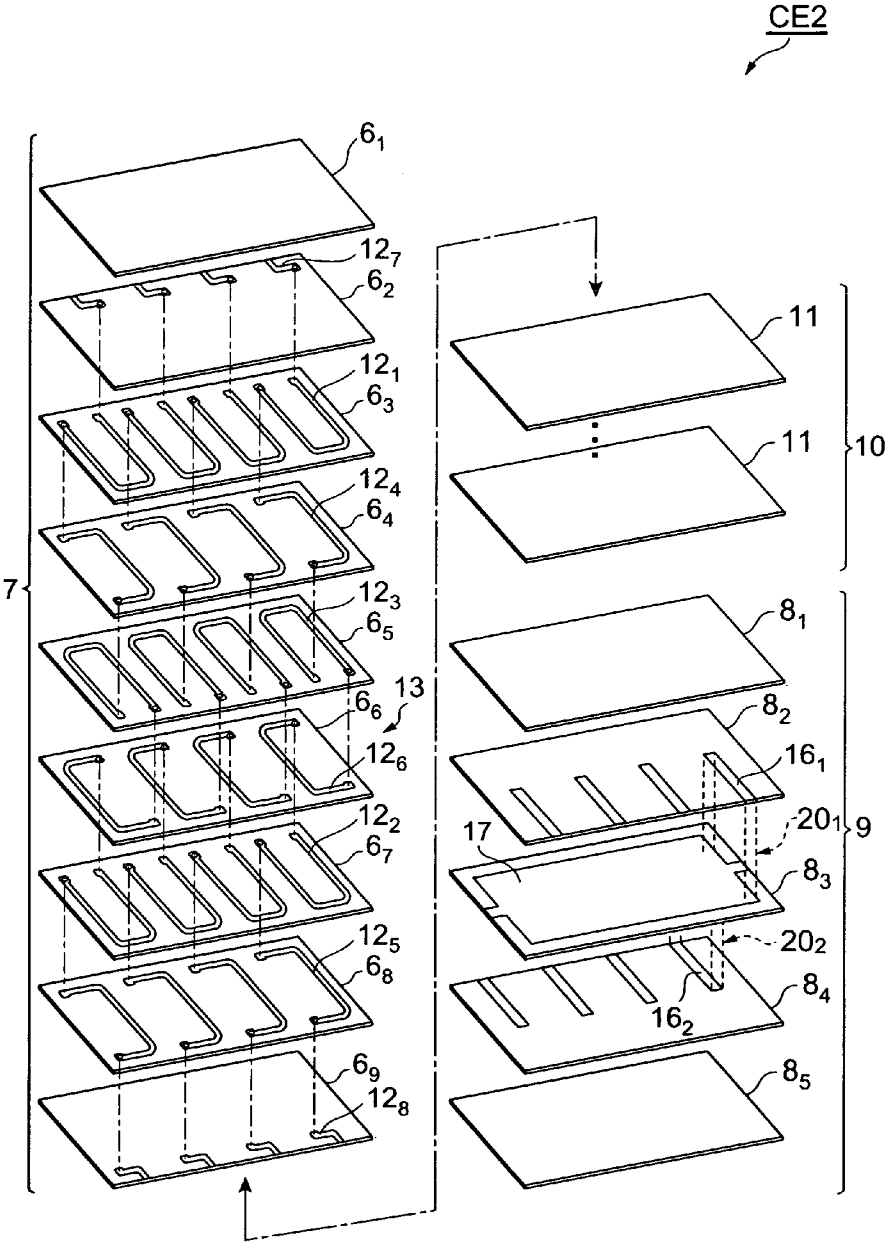
FIG. 7 is an exploded perspective view of a modified example of the multilayer body of the multilayer filter of the second embodiment.

The multilayer body CE2 can also have the configuration described below. FIG. 7 is an exploded perspective view of a modified example of a multilayer body CE2. In the multilayer body CE2 shown in FIG. 7, the positions of formation of the hot electrodes and ground electrodes are different from those in the multilayer body CE2 of the second embodiment.

That is, as shown in FIG. 7, the four hot electrodes $\mathbf{16}_1$ are arranged in a row on the varistor layer $\mathbf{8}_2$, and the four hot electrodes $\mathbf{16}_2$ are arranged in a row on the varistor layer $\mathbf{8}_4$. The ground electrode 17 is formed on the varistor layer $\mathbf{8}_3$.

In a varistor stacked-layer portion 9 configured in this way, by enclosing the varistor layer $\mathbf{8}_3$ between the ground electrode 17 and four hot electrodes $\mathbf{16}_1$, four varistors $\mathbf{20}_1$ are formed. And, by enclosing the varistor layer $\mathbf{8}_2$ between the ground electrode 17 and the four hot electrodes $\mathbf{16}_2$, four varistors $\mathbf{20}_2$ are formed. In this case also, varistor layers $\mathbf{8}_2$ and $\mathbf{8}_3$ with an extremely low probability of containing a Cu component are positioned in the regions enclosed between the hot electrodes $\mathbf{16}_1$ and $\mathbf{16}_2$ and the ground electrodes $\mathbf{17}_1$ and $\mathbf{17}_2$, so that degradation of the attenuation characteristics can be suppressed.

Third Embodiment

Figure 8:
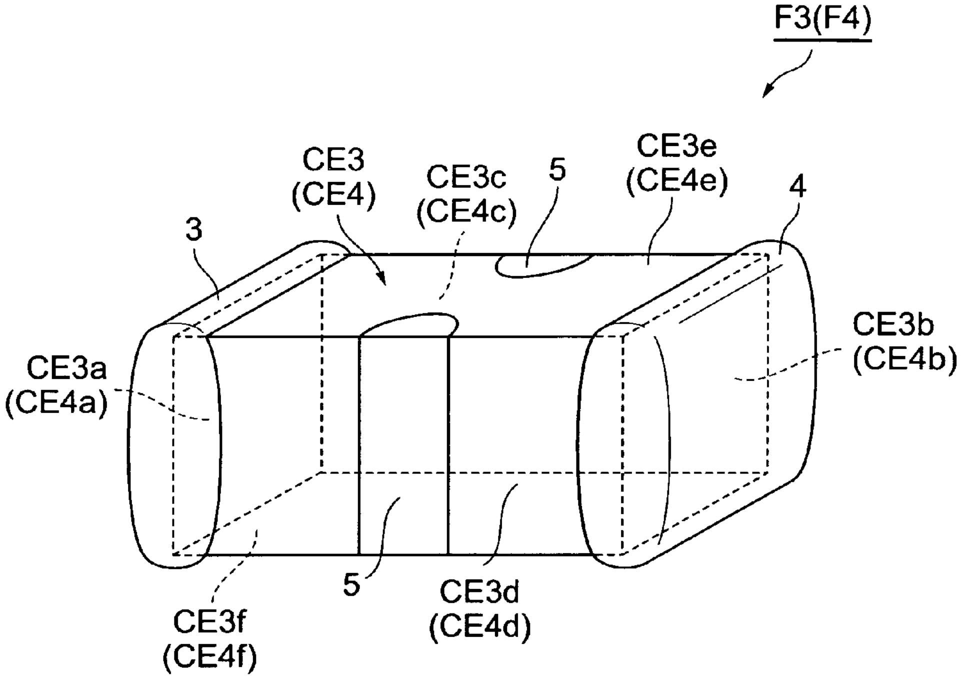
FIG. 8 is a schematic perspective view showing the multilayer filter of a third embodiment.
Figure 9:
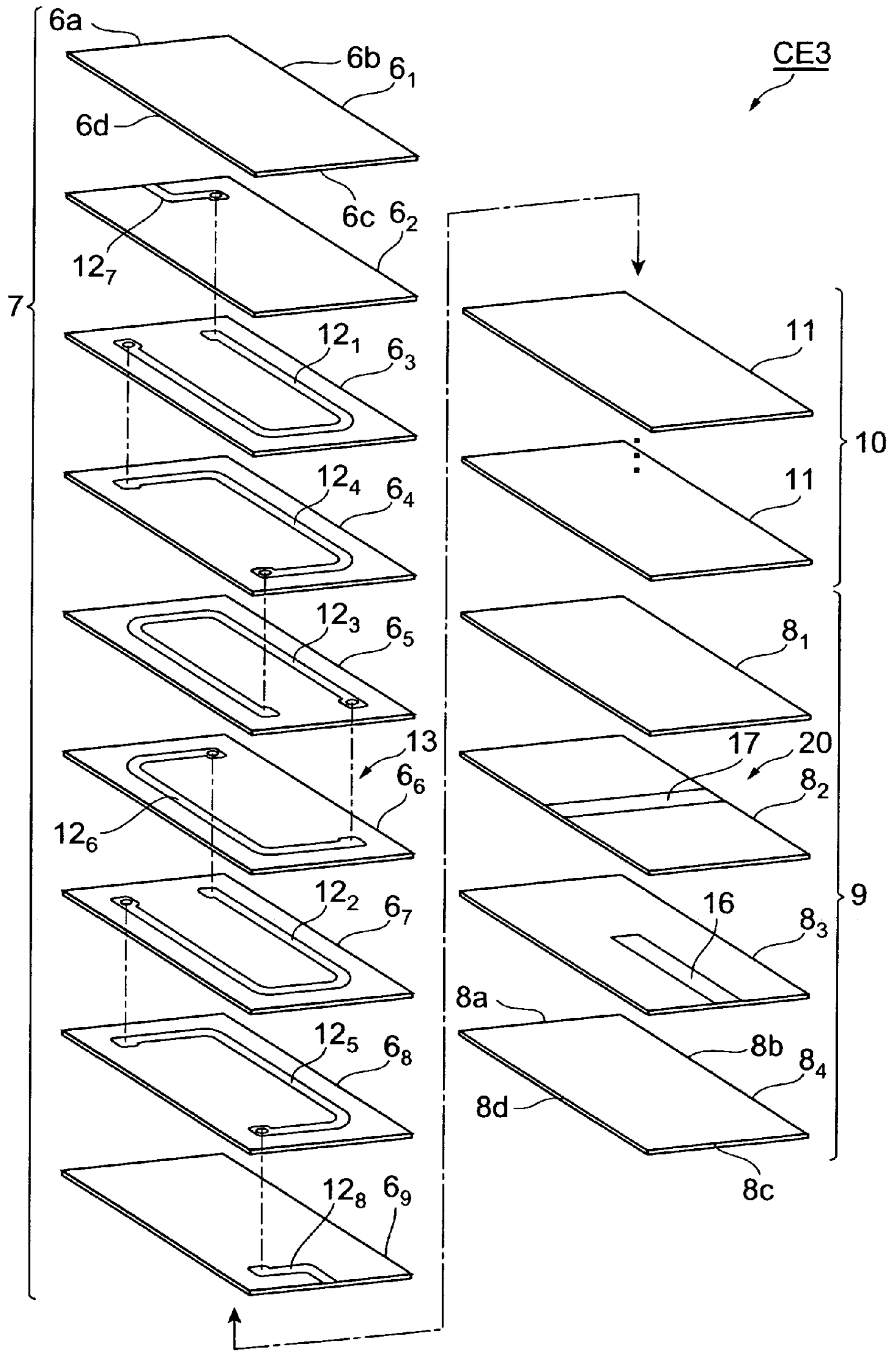
FIG. 9 is an exploded perspective view showing the multilayer body of the multilayer filter of the third embodiment.
Figure 10:
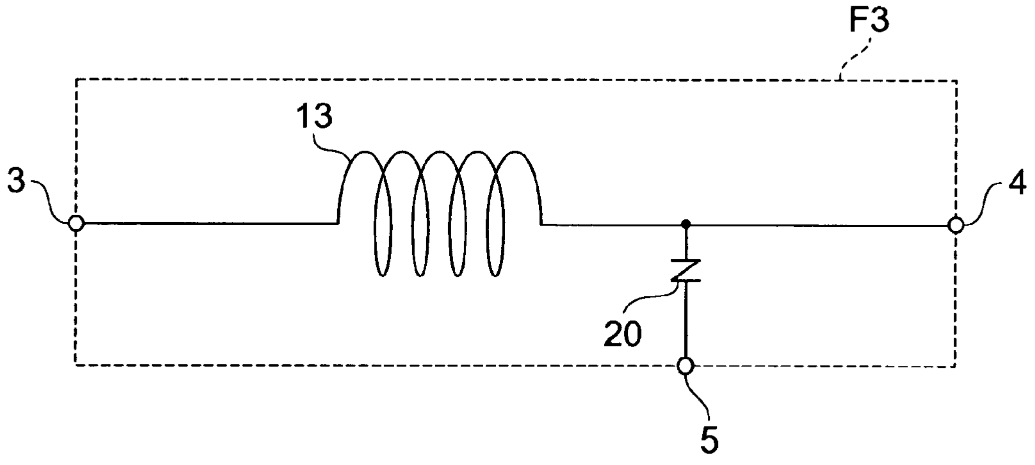
FIG. 10 is an equivalent circuit diagram of the multilayer filter of the third embodiment.

FIG. 8 is a schematic perspective view showing the multilayer filter of a third embodiment, FIG. 9 is an exploded perspective view showing the multilayer body of the multilayer filter of the third embodiment, and FIG. 10 is an equivalent circuit diagram of the multilayer filter of the third embodiment. FIG. 8 also combines a perspective view of the multilayer filter of a fourth embodiment, described below.

The multilayer filter F3 shown in FIG. 8 is provided with one L-type filter element, comprising an inductor 13 and varistor 20, as shown in FIG. 10. The multilayer filter F3 comprises a multilayer body CE3 with substantially a rectangular parallelepiped shape; one input terminal electrode 3; one output terminal electrode 4; and a pair of ground terminal electrodes 5.

The multilayer body CE3 has first and second end faces CE3*a* and CE3*b*, first and second side faces CE3*c* and CE3*d*, and first and second main faces CE3*e* and CE3*f*. The first and second main faces CE3*e* and CE3*f* have a rectangular shape and are mutually opposed. The first and second end faces CE3*a* and CE3*b* extend in the direction of the short edges of the first and second main faces CE3*e* and CE3*f* so as to connect the first and second main faces CE3*e* and CE3*f*, and are mutually opposed. The first and second side faces CE3*c* and CE3*d* extend in the direction of the long edges of the first and second main faces CE3*e* and CE3*f* so as to connect the first and second main faces CE3*e* and CE3*f*, and are mutually opposed.

The input terminal electrode 3 is provided on the first end face CE3*a* of the multilayer body CE3, and has a shape extending in the layer-stacking direction of the multilayer body CE3. The output terminal electrode 4 is provided on the second end face CE3*b* of the multilayer body CE3, and has a shape extending in the layer-stacking direction of the multilayer body CE3. The input terminal electrode 3 and output terminal electrode 4 are provided so as to be mutually opposed.

Of the pair of ground terminal electrodes 5, one is positioned in the center portion of the first side face CE3*c* of the multilayer body CE1, and has a shape extending in the layer-stacking direction of the multilayer body CE3. Of the pair of ground terminal electrodes 5, the other is positioned in the center portion of the second end face CE3*d* of the multilayer body CE1, and has a shape extending in the layer-stacking direction of the multilayer body CE3. The pair of ground terminal electrodes 5 are provided so as to be mutually opposed.

The multilayer body CE3 is explained in detail. As shown in FIG. 7, the multilayer body CE3 comprises an inductor stacked-layer portion 7, formed by stacking a plurality of inductor layers $\mathbf{6}_1$ to $\mathbf{6}_9$; a varistor stacked-layer portion 9, formed by stacking a plurality of varistor layers $\mathbf{8}_1$ to $\mathbf{8}_5$; and an intermediate stacked-layer portion 10. The inductor stacked-layer portion 7 and the varistor stacked-layer portion 9 are stacked with the intermediate stacked-layer portion 10 intervening. The inductor layers $\mathbf{6}_1$ to $\mathbf{6}_9$ and varistor layers $\mathbf{8}_1$ to $\mathbf{8}_5$ have a shape similar to that in the first embodiment, and are formed from similar materials.

On the respective inductor layers $\mathbf{6}_2$ to $\mathbf{6}_9$ are formed inductor conductor portions $\mathbf{12}_1$ to $\mathbf{12}_8$, comprising material containing Ag and Pd. Of the inductor conductor portions $\mathbf{12}_1$ to $\mathbf{12}_8$, inductor conductor portions $\mathbf{12}_7$ and $\mathbf{12}_8$ are provided to lead out terminal electrodes, and inductor conductor portions $\mathbf{12}_1$ to $\mathbf{12}_6$ are formed in coil shapes to increase the inductance value.

More specifically, on each of the inductor layers $\mathbf{6}_3$ and $\mathbf{6}_7$ are formed inductor conductor portions $\mathbf{12}_1$ and $\mathbf{12}_2$, having a U-shape along the first and second side faces CE3*c* and CE3*d* and the second end face CE3*b* of the multilayer body CE3. On the inductor layer $\mathbf{6}_5$ is formed an inductor conductor portion $\mathbf{12}_3$, having a U-shape along the first and second side faces CE3*c* and CE3*d* and the first end face CE3*a* of the multilayer body CE3. On the respective inductor layers $\mathbf{6}_4$ and $\mathbf{6}_8$ are formed the inductor conductor portions $\mathbf{12}_4$ and $\mathbf{12}_5$, having a U-shape along the first and second end faces CE3*a* and CE3*b* and the first side face CE3*c* of the multilayer body CE3. On the inductor layer $\mathbf{6}_6$ is formed an inductor conductor portion $\mathbf{12}_6$, having a U-shape along the first and second end faces CE3*a* and CE3*b* and the second side face CE3*d* of the multilayer body CE3. On the inductor layer $\mathbf{6}_2$ is formed an inductor conductor portion $\mathbf{12}_7$, and on the inductor layer $\mathbf{6}_9$ is formed an inductor conductor portion $\mathbf{12}_8$.

One end of the inductor conductor portion $\mathbf{12}_7$ leads out to the first end face CE3*a* of the multilayer body CE3, and is connected to the input terminal electrode 3. The other end of each of the inductor conductor portion $\mathbf{12}_7$ is connected to one end of the inductor conductor portion $\mathbf{12}_1$ via a through-hole, and the other end of the inductor conductor portion $\mathbf{12}_1$ is connected via a through-hole to one end of the inductor conductor portion $\mathbf{12}_4$. The other end of the inductor conductor portion $\mathbf{12}_4$ is connected via a through-hole to one end of the inductor conductor portion $\mathbf{12}_3$, and the other end of the inductor conductor portion $\mathbf{12}_3$ is connected via a through-hole to one end of the inductor conductor portion $\mathbf{12}_6$. The other end, of the inductor conductor portion $\mathbf{12}_6$ is connected via a through-hole to one end of the inductor conductor portion $\mathbf{12}_2$, and the other end of the inductor conductor portion $\mathbf{12}_2$ is connected via a through-hole to one end of the inductor conductor portion $\mathbf{12}_5$. The other end of the inductor conductor portion $\mathbf{12}_5$ is connected via a through-hole to one end of the inductor conductor portion $\mathbf{12}_8$, and the other end of the inductor conductor portion $\mathbf{12}_8$ is led out to the second end face CE3*b* of the multilayer body CE3, and connected to the output terminal electrode 4. In this way, the inductor conductor portions $\mathbf{12}_1$ to $\mathbf{12}_8$ are electrically connected, to form the inductor 13 shown in FIG. 10.

A hot electrode 16 and ground electrode 17 are arranged between the varistor layers $\mathbf{8}_1$ to $\mathbf{8}_4$, so as to be opposed in the direction of layer stacking of the varistor layers $\mathbf{8}_1$ to $\mathbf{8}_4$. The hot electrode 16 and ground electrode 17 comprise material containing Ag and Pd.

More specifically, a hot electrode 16 is formed on the varistor layer $\mathbf{8}_3$, in substantially a strip shape extending along the first and second side faces CE3*c* and CE3*d* of the multilayer body CE3. One end of the hot electrode 16 is led out to the second end face CE3*b* of the multilayer body CE3, and is connected to the output terminal electrode 4. That is, one end of the hot electrode 16 is connected to the other end of the inductor conductor portion $\mathbf{12}_8$. On the varistor layer $\mathbf{8}_2$ is formed a ground electrode 17, in substantially a strip shape extending along the first and second end faces CE3*a* and CE3*b* of the multilayer body CE3. One end of the ground electrode 17 is led out to the first side face CE3*c* of the multilayer body CE3, and is connected to the ground terminal electrode 5 arranged on the first side face CE3*c*. The other end of the ground electrode 17 is led out to the second side face CE3*d* of the multilayer body CE3, and connected to the ground terminal electrode 5 positioned on the second side face CE3*d*.

The hot electrode 16 and ground electrode 17 partially overlap, with the varistor layer $\mathbf{8}_2$ intervening, when seen from the layer-stacking direction of the varistor layers $\mathbf{8}_1$ to $\mathbf{8}_4$, and are opposed. The varistor 20 shown in FIG. 10 is formed by means of the hot electrode 16 and ground electrode 17 placed in this way.

The intermediate layer 11 of the intermediate stacked-layer portion 10 is similar to the intermediate layer 11 in the first embodiment. That is, the intermediate layer 11 is thin and rectangular in shape, and has composition different from those of the inductor layers $\mathbf{6}_1$ to $\mathbf{6}_9$ and the varistor layers $\mathbf{8}_1$ to $\mathbf{8}_4$. More specifically, the intermediate layer 11 comprises an insulating material having electrically insulating properties; as the insulating material, for example, a material the main components of which are ZnO and $Fe_2O_3$ is used. The intermediate layer 11 does not contain a Cu component.

In a multilayer filter F3 configured as described above also, a varistor layer $\mathbf{8}_2$ is positioned in the region enclosed between the hot electrode 16 and ground electrode 17, and for reasons similar to those of the first embodiment, the probability that the varistor layer $\mathbf{8}_2$ contains a Cu component is extremely low. Hence degradation of the attenuation characteristics can be suppressed.

Fourth Embodiment

Figure 11:
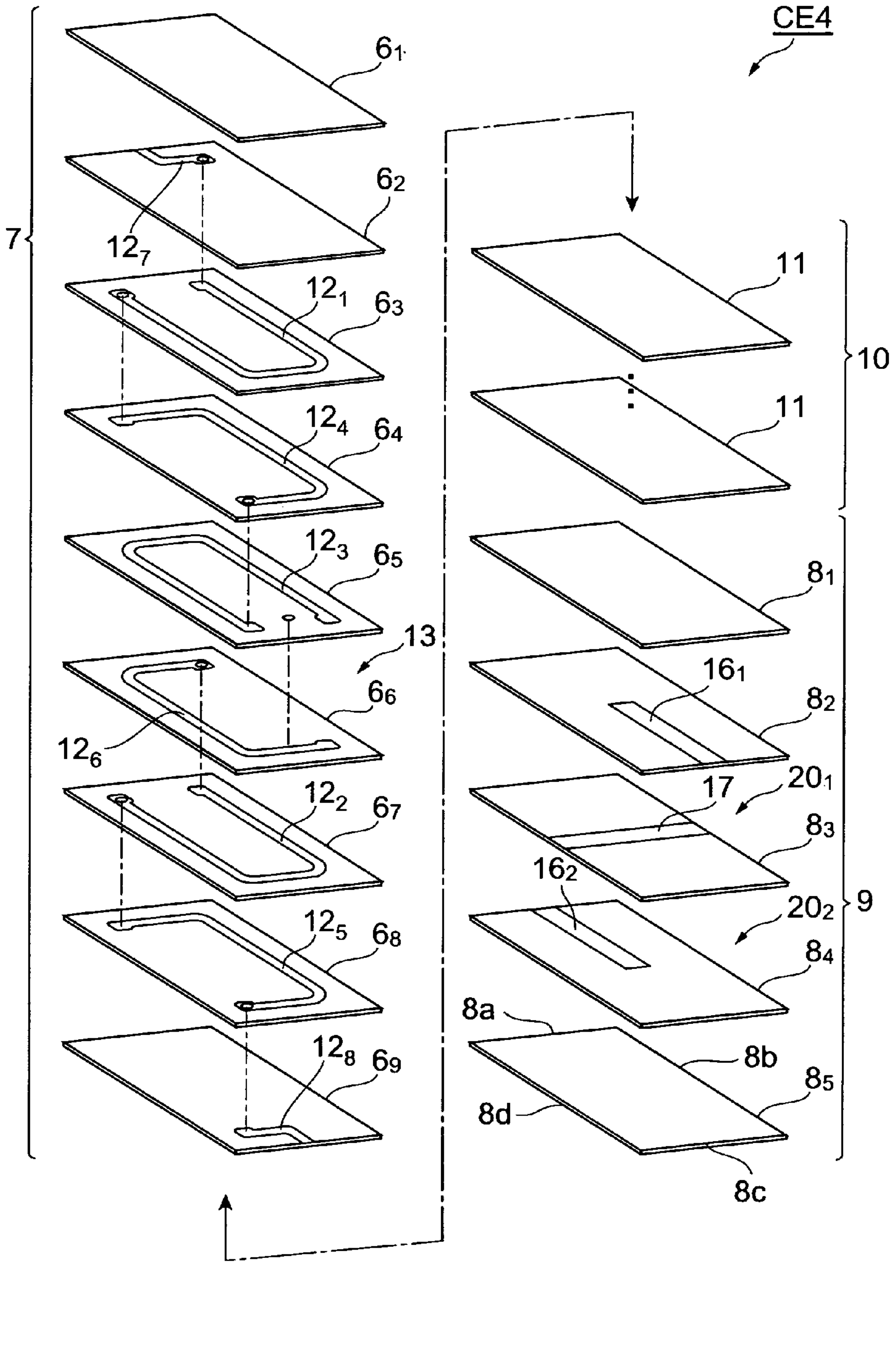
FIG. 11 is an exploded perspective view of the multilayer body of the multilayer filter of a fourth embodiment.
Figure 12:
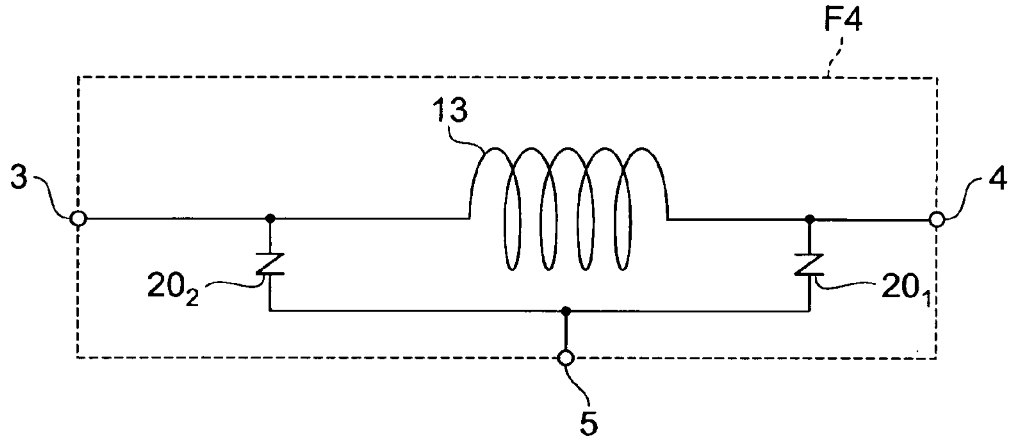
FIG. 12 is an equivalent circuit diagram of the multilayer filter of the fourth embodiment.

FIG. 11 is an exploded perspective view showing the multilayer body of the multilayer filter of a fourth embodiment, and FIG. 12 is an equivalent circuit diagram of the multilayer filter of the fourth embodiment. As shown in FIG. 12, the multilayer filter F4 of the fourth embodiment is provided with one Π-type filter element, comprising an inductor 13 and varistors $\mathbf{20}_1$ and $\mathbf{20}_2$. The multilayer filter F4 of the fourth embodiment has a multilayer body CE4 the configuration of which differs from that of the multilayer body CE3 of the multilayer filter F3 of the third embodiment. More specifically, the configuration of the varistor stacked-layer portion 9 of the multilayer body CE4 differs in part from that of the multilayer body CE3.

That is, the multilayer body CE4 has first and second end faces CE4*a* and CE4*b*; first and second side faces CE4*c* and CE4*d*; and first and second main faces CE4*e* and CE4*f*. These faces are similar to the first and second end faces CE1*a* and CE1*b*, first and second side faces CE1*c* and CE1*d*, and first and second main faces CE1*e* and CE1*f* of the multilayer body CE1. The multilayer body CE4 comprises an inductor stacked-layer portion 7, a varistor stacked-layer portion 9, and an intermediate stacked-layer portion 10, and the configurations of the inductor stacked-layer portion 7 and intermediate stacked-layer portion 10 are the same as in the multilayer body CE3.

The varistor stacked-layer portion 9 comprises a plurality of varistor layers $\mathbf{8}_2$, $\mathbf{8}_3$, $\mathbf{8}_4$ stacked in order between a varistor layer $\mathbf{8}_1$ and varistor layer $\mathbf{8}_5$. The configurations of the varistor layers $\mathbf{8}_1$ and $\mathbf{8}_5$ are the same as in the multilayer body CE3, while the configurations of the varistor layers $\mathbf{8}_2$, $\mathbf{8}_3$, $\mathbf{8}_4$ differ from those in the multilayer body CE3.

On the varistor layer $\mathbf{8}_2$ is formed a hot electrode $\mathbf{16}_1$, having substantially a strip shape extending along the first and second side faces CE4*c* and CE1*d* of the multilayer body CE4. One end of the hot electrode $\mathbf{16}_1$ leads out to the second end face CE1*b* of the multilayer body CE4, and is connected to the output terminal electrode 4. That is, one end of the hot electrode $\mathbf{16}_1$ is connected to the other end of the inductor conductor portion $\mathbf{12}_8$. On the varistor layer $\mathbf{8}_4$ is formed a hot electrode $\mathbf{16}_2$, having substantially a strip shape extending along the first and second side faces CE4*c* and CE1*d* of the multilayer body CE4. One end of the hot electrode $\mathbf{16}_2$ leads out to the first end face CE1*a* of the multilayer body CE4 and is connected to the input terminal electrode 3. That is, one end of the hot electrode $\mathbf{16}_2$ is connected to the other end of the inductor conductor portion $\mathbf{12}_7$.

On the varistor layer $\mathbf{8}_3$ is formed a ground electrode 17, having substantially a strip shape extending along the first and second end faces CE4*a* and CE4*b* of the multilayer body CE4. One end of the ground electrode 17 leads out to the first side face CE4*c* of the multilayer body CE4 and is connected to the ground terminal electrode 5 positioned on the first side face CE4*c*. The other end of the ground electrode 17 leads out to the second side face CE4*d* of the multilayer body CE4, and is connected to the ground terminal electrode 5 positioned on the second side face CE4*d*.

In a varistor stacked-layer portion 9 configured in this way, by enclosing the varistor layer $\mathbf{8}_2$ between the ground electrode 17 and hot electrode $\mathbf{16}_2$, the varistor 20, is formed. And, by enclosing the varistor layer $\mathbf{8}_3$ between the ground electrode 17 and the hot electrode $\mathbf{16}_2$, the varistor $\mathbf{20}_2$ is formed.

In a multilayer filter F4 configured as described above also, the varistor layers $\mathbf{8}_2$ and $\mathbf{8}_3$ are positioned in the regions enclosed between the hot electrodes $\mathbf{16}_1$ and $\mathbf{16}_2$ and the ground electrode 17, and the probability that the varistor layers $\mathbf{8}_2$ and $\mathbf{8}_3$ contain a Cu component is extremely low, so that degradation of the attenuation characteristics can be suppressed.

Fifth Embodiment

Figure 13:
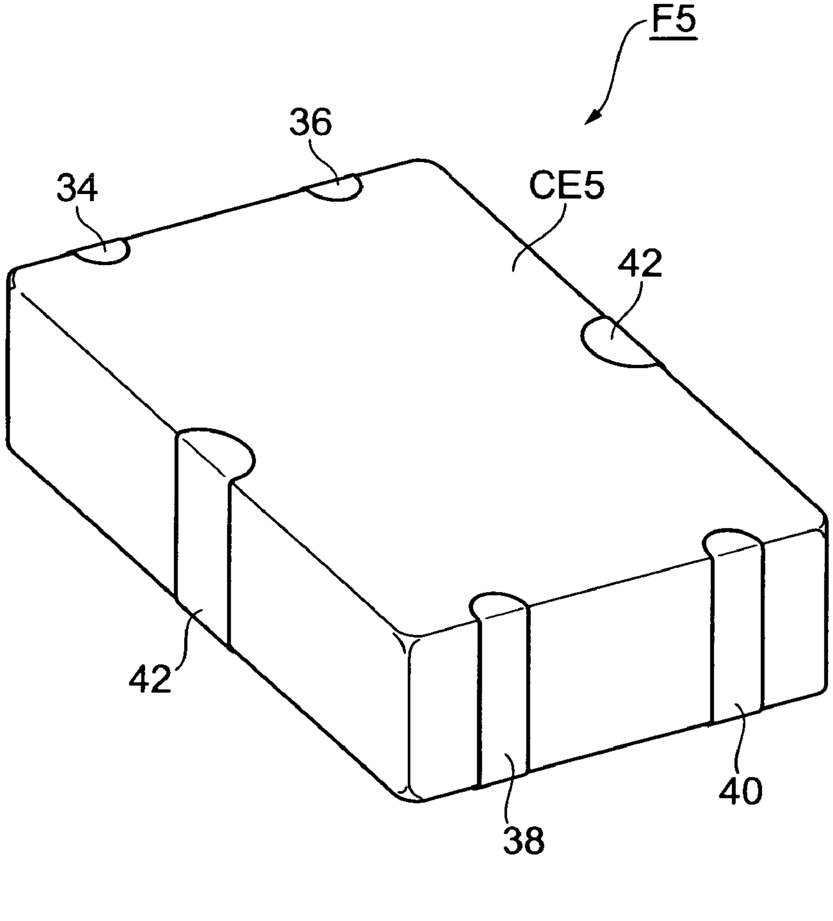
FIG. 13 is a schematic perspective view showing the multilayer filter of a fifth embodiment.
Figure 14:
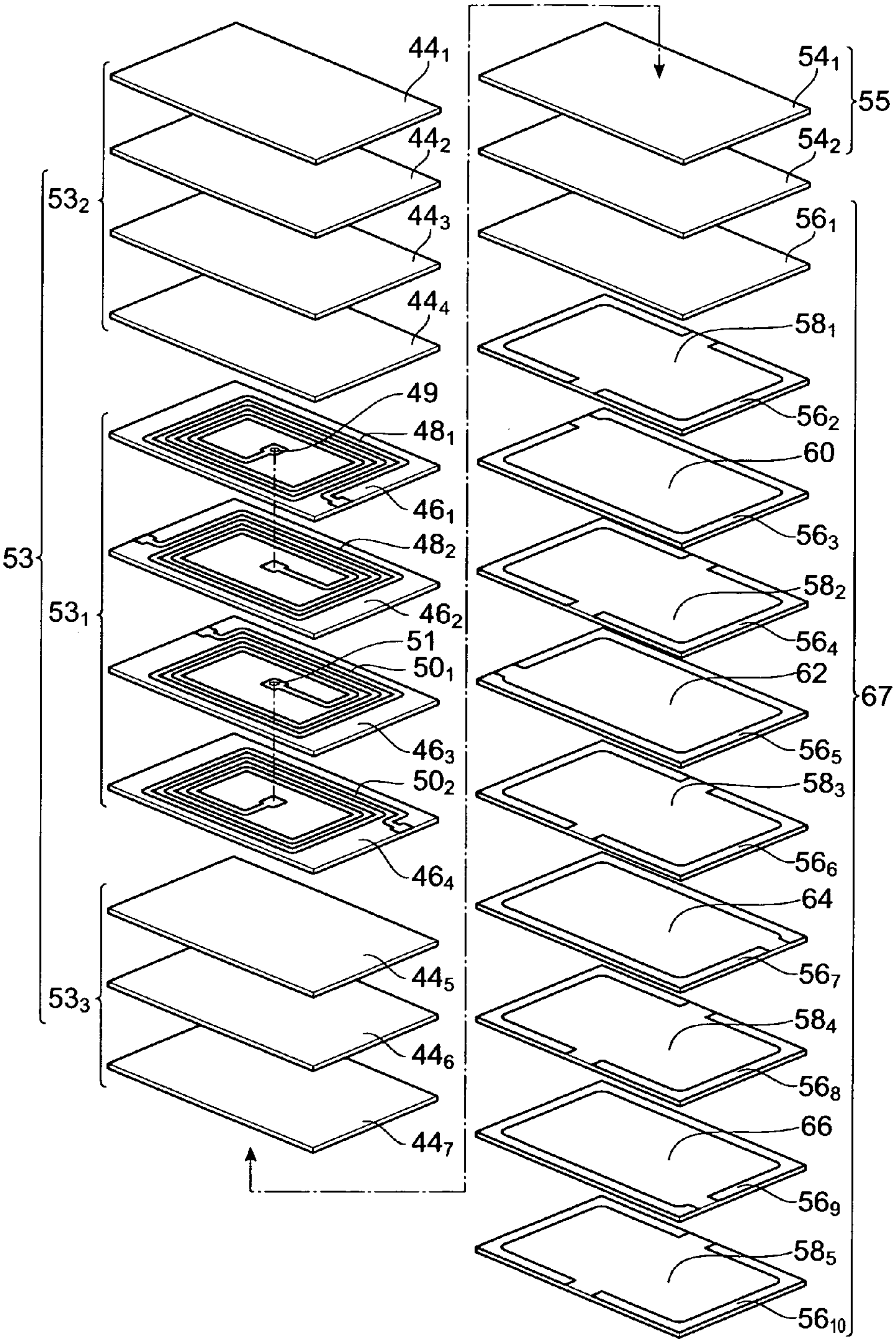
FIG. 14 is an exploded perspective view showing the multilayer body of the multilayer filter of the fifth embodiment.
Figure 15:
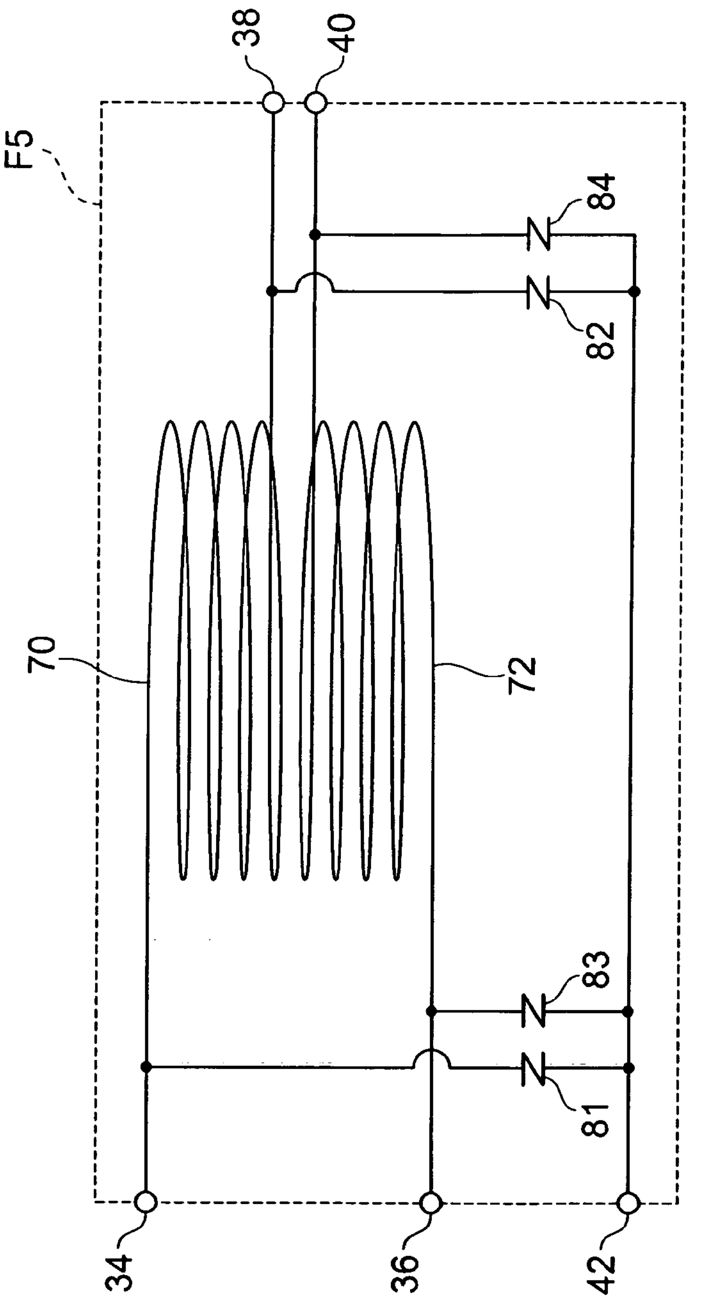
FIG. 15 is an equivalent circuit diagram of the multilayer filter of the fifth embodiment.

FIG. 13 is a perspective view of the multilayer filter of a fifth embodiment. FIG. 14 is an exploded perspective view of the multilayer filter of the fifth embodiment. FIG. 15 is an equivalent circuit diagram of the multilayer filter of the fifth embodiment.

As shown in FIG. 15, the multilayer filter F5 is provided with one Π-type filter element; this Π-type filter element comprises a plurality of (in this embodiment, two) coils 70 and 72, forming common-mode choke coils, and a plurality of (in this embodiment, four) varistors 81 to 84.

As shown in FIG. 13, the multilayer filter F5 comprises a multilayer body CE5 with substantially a rectangular parallelepiped shape. Input terminal electrodes 34 and 36 are formed on one end portion in the length direction of the multilayer body CE5, and output terminal electrodes 38 and 40 are formed on the other end portion in the length direction of the multilayer body CE5. A pair of ground terminal electrodes 42 are formed on the two side faces in the length direction of the multilayer body CE5.

As shown in FIG. 14, the multilayer body CE5 has an inductor stacked-layer portion 53, an intermediate stacked-layer portion 55, and a varistor stacked-layer portion 67.

The inductor stacked-layer portion 53 has a first sintered member, formed by stacking inductor layers $\mathbf{44}_1$ to $\mathbf{44}_7$ and $\mathbf{46}_1$ to $\mathbf{46}_4$; a coil conductor 48, comprising conductor patterns $\mathbf{48}_1$ and $\mathbf{48}_2$; and a coil conductor 50 comprising conductor patterns $\mathbf{50}_1$ and $\mathbf{50}_2$. The coil conductors 48 and 50 are placed within the first sintered member. More specifically, the coil conductors 48 and 50 are placed between the inductor layers $\mathbf{44}_1$ to $\mathbf{44}_7$ and $\mathbf{46}_1$ to $\mathbf{46}_4$. The coil conductor 48 and coil conductor 50 are mutually magnetically linked within the first sintered member.

The first sintered member is integrally fired with the second sintered member of the intermediate stacked-layer portion 55 and varistor stacked-layer portion 67. The first sintered member has a first layer $\mathbf{53}_1$ and second layers $\mathbf{53}_2$ and $\mathbf{53}_3$. The first layer $\mathbf{53}_1$ comprises a portion enclosed between the conductor patterns $\mathbf{48}_1$, $\mathbf{48}_2$, $\mathbf{50}_1$, $\mathbf{50}_2$ in the direction of layer stacking (first direction) of the inductor layers $\mathbf{44}_1$ to $\mathbf{44}_7$ and $\mathbf{46}_1$ to $\mathbf{46}_4$.

More specifically, the first layer $\mathbf{53}_1$ comprises inductor layers $\mathbf{46}_1$ to $\mathbf{46}_4$ on which are formed conductor patterns $\mathbf{48}_1$, $\mathbf{48}_2$, $\mathbf{50}_1$, $\mathbf{50}_2$. Conductor pattern 48, is formed on inductor layer $\mathbf{46}_1$, and conductor pattern $\mathbf{48}_2$ is formed on inductor layer $\mathbf{46}_2$. Conductor patterns $\mathbf{48}_1$ and $\mathbf{48}_2$ are formed in spiral shapes from the center toward the periphery. In conductor pattern $\mathbf{48}_1$, the portion of one end positioned on the periphery side leads out to the end face of inductor layer $\mathbf{46}_1$ so as to enable connection to the output terminal electrode 38. In conductor pattern $\mathbf{48}_2$, the portion of one end positioned on the periphery side leads out to the end face of inductor layer $\mathbf{46}_2$ so as to enable connection to the input terminal electrode 34. The portion of the other end of conductor pattern $\mathbf{48}_1$ and the portion of the other end of conductor pattern $\mathbf{48}_2$ are electrically connected by means of a via conductor 49 formed on the inductor layer $\mathbf{46}_1$. Conductor patterns $\mathbf{48}_1$ and $\mathbf{48}_2$ form a coil conductor 48, and this coil conductor 48 is equivalent to the coil 70 shown in the circuit diagram of FIG. 15.

Conductor pattern $\mathbf{50}_1$ is formed on inductor layer $\mathbf{46}_3$, and conductor pattern $\mathbf{50}_2$ is formed on inductor layer $\mathbf{46}_4$. Conductor patterns $\mathbf{50}_1$ and $\mathbf{50}_2$ are formed in spiral shapes from the center toward the periphery. In conductor pattern $\mathbf{50}_1$, the portion of one end positioned on the periphery side leads out to the end face of inductor layer $\mathbf{46}_3$ so as to enable connection to the input terminal electrode 36. In conductor pattern $\mathbf{50}_2$, the portion of one end positioned on the periphery side leads out to the end face of inductor layer $\mathbf{46}_4$ so as to enable connection to the output terminal electrode 40. The portion of the other end of conductor pattern $\mathbf{50}_1$ and the portion of the other end of conductor pattern $\mathbf{50}_2$ are electrically connected by means of a via conductor 51 formed on the inductor layer $\mathbf{46}_3$. Conductor patterns $\mathbf{50}_1$ and $\mathbf{50}_2$ form a coil conductor 50, and this coil conductor 50 is equivalent to the coil 72 shown in the circuit diagram of FIG. 15.

The second layers $\mathbf{52}_2$ and $\mathbf{52}_3$ are portions which enclose the coil conductors 48 and 50 in the layer-stacking direction of the inductor layers $\mathbf{44}_1$ to $\mathbf{44}_7$ and $\mathbf{46}_1$ to $\mathbf{46}_4$. More specifically, the second layer $\mathbf{53}_2$ is positioned on the upper side of the first layer $\mathbf{53}_1$, and comprises inductor layers $\mathbf{44}_1$ to $\mathbf{44}_4$ on which no conductor patterns are formed. The second layer $\mathbf{53}_3$ is positioned on the lower side of the first layer $\mathbf{53}_1$, and comprises inductor layers $\mathbf{44}_4$ to $\mathbf{44}_7$ on which no conductor patterns are formed. In this embodiment, the inductor layer $46_4$ is comprised by the first layer $53_1$, but may be comprised by the second layer $53_3$ rather than the first layer $53_1$.

The inductor layers $44_1$ to $44_7$ and $46_1$ to $46_4$ comprise nonmagnetic material. As a result, the regions enclosed between the conductor pattern $48_2$ and conductor pattern $50_1$ are formed from nonmagnetic material. Further, the region positioned on the inside of the conductor pattern $48_1$, the region positioned on the inside of the conductor pattern $48_2$, the region positioned on the inside of the conductor pattern $50_1$, the region positioned on the inside of the conductor pattern $50_2$, the region enclosed between the conductor pattern $48_1$ and the conductor pattern $48_2$, and the region enclosed between the conductor pattern $50_1$ and the conductor pattern $50_2$, are formed from nonmagnetic material. As the inductor layers $41_1$ to $44_7$ and $46_1$ to $46_4$, a ferrite (for example, a Zn system ferrite) can be used. When using a Zn system ferrite, a high inductance value can be obtained, so that satisfactory filter characteristics can be attained. The inductor layers $44_1$ to $44_7$ and $46_1$ to $46_4$ may contain a Cu component.

As the conducting material used in the conductor patterns $48_1$, $48_2$, $50_1$, $50_2$ and the via conductors 49 and 51, a metal material which can be fired simultaneously with the inductor layers $44_1$ to $44_7$ and $46_1$ to $46_4$ is used. More specifically, because the ferrite firing temperature is normally approximately 800° C. to 1400° C., a metal material which does not melt at this temperature is used. For example, Ag, Pd, or alloys of these are appropriate for use.

The multilayer body CE5 has, in addition to the inductor stacked-layer portion 53, a varistor stacked-layer portion 67 which manifests nonlinear voltage characteristics. The varistor stacked-layer portion 67 has a second sintered member, formed by stacking a plurality of varistor layers $56_1$ to $56_{10}$, hot electrodes 60, 62, 64, 66, and ground electrodes $58_1$ to $58_5$ (a plurality of internal electrodes).

The plurality of varistor layers $56_1$ to $56_{10}$ are stacked in this order from above. On the varistor layers $56_2$, $56_4$, $56_6$, $56_8$, $56_{10}$ are respectively formed ground electrodes $58_1$ to $58_5$ having substantially a strip shape, electrically connected to the ground terminal electrode 42. On the varistor layer $56_3$ is formed a hot electrode 60 having substantially a strip shape, electrically connected to the input terminal electrode 36, on the varistor layer $56_5$ is formed a hot electrode 62 having substantially a strip shape, electrically connected to the input terminal electrode 34, on the varistor layer $56_7$ is formed a hot electrode 64 having substantially a strip shape, electrically connected to the output terminal electrode 40, and on the varistor layer $56_9$ is formed a hot electrode 66 having substantially a strip shape, electrically connected to the output terminal electrode 38.

The varistor 83 shown in FIG. 15 is formed in the varistor stacked-layer portion 67 by causing the hot electrode 60 and ground electrodes $58_1$ and $58_2$ to be opposed and partially overlapping, as seen in the layer-stacking direction, with the varistor layers $56_2$ and $56_3$ intervening. The varistor 81 shown in FIG. 15 is formed in the varistor stacked-layer portion 67 by causing the hot electrode 62 and ground electrodes $58_2$ and $58_3$ to be opposed and partially overlapping, as seen in the layer-stacking direction, with the varistor layers $56_4$ and $56_5$ intervening. The varistor 84 shown in FIG. 15 is formed in the varistor stacked-layer portion 67 by causing the hot electrode 64 and ground electrodes $58_3$ and $58_4$ to be opposed and partially overlapping, as seen in the layer-stacking direction, with the varistor layers $56_6$ and $56_7$ intervening. The varistor 82 shown in FIG. 15 is formed in the varistor stacked-layer portion 67 by causing the hot electrode 66 and ground electrodes $58_4$ and $58_5$ to be opposed and partially overlapping, as seen in the layer-stacking direction, with the varistor layers $56_8$ and $56_9$ intervening. In this way, by causing the hot electrodes 60, 62, 64, 66 and ground electrodes $58_1$ to $58_5$ to be opposed and partially overlapping as seen in the layer-stacking direction, with varistor layers $56_2$ to $56_9$ intervening, four varistors 81 to 84 are formed in the varistor stacked-layer portion 67.

The varistor layers $56_1$ to $56_{10}$ are formed from ceramic material the main component of which is ZnO. This ceramic material may comprise, as added components, Pr, Bi, Co, Al, and similar. When Pr is added and Co is comprised, excellent varistor characteristics are obtained, and a high permittivity ($\epsilon$) is attained. Also, when Al is further comprised, low resistivity results. In addition, other additives such as for example Cr, Ca, Si, K, and other elements may be comprised as necessary. However, the varistor layers $56_1$ to $56_{10}$ do not contain a Cu component.

The ground electrodes $58_1$ to $58_5$ and hot electrodes 60, 62, 64, 66 are formed from conductive material similar to that of the ground electrodes $17_1$ and $17_2$ and hot electrodes 16 in the first embodiment. That is, the ground electrodes $58_1$ to $58_5$ and hot electrodes 60, 62, 64, 66 employ a metal material which can be fired simultaneously with the ceramic material forming the varistor layers $56_1$ to $56_{10}$. More specifically, the varistor ceramic firing temperature is normally approximately 800° C. to 1400° C., and so as a metal material which does not melt at such temperatures, for example Ag, Pd, alloys of these, or similar can be used.

The multilayer body CE5 has, in addition to an inductor stacked-layer portion 53 and varistor stacked-layer portion 67, an intermediate stacked-layer portion 55. The intermediate stacked-layer portion 55 is a portion provided for the purpose of adjusting the shrinkage rates between the inductor stacked-layer portion 53 and the varistor stacked-layer portion 67, and is positioned between the inductor stacked-layer portion 53 and the varistor stacked-layer portion 67. The intermediate stacked-layer portion 55 comprises intermediate layers $54_1$ and $54_2$. The intermediate layers $54_1$ and $54_2$ are layers having insulating properties, and are for example formed from ceramic material the main component of which is ZnO or $Fe_2O_3$, and which does not contain a Cu component. By providing such an intermediate stacked-layer portion 55, diffusion of a Cu component from the inductor stacked-layer portion 53 into the varistor stacked-layer portion 67 can be more reliably suppressed.

Next, a method of manufacture of the above-described multilayer electronic component E5 is explained.

First, inductor green sheets which are to become the inductor layers $44_1$ to $44_7$ and $46_1$ to $46_4$ are prepared. These inductor green sheets are formed by using the doctor blade method to apply a slurry, the starting material of which is for example a Zn system ferrite, onto a film form to a thickness of for example approximately 20 μm.

Next, through-holes are formed at prescribed positions in the inductor green sheets, that is, at positions at which via conductors 49 and 51 are to be formed. The through-holes can be formed by laser machining or similar. After through-hole formation, a screen printing method or similar is used to form conductor patterns $48_1$, $48_2$, $50_1$, $50_2$ on the inductor green sheets. Further, the through-holes formed in the inductor green sheets are filled with a conductive paste to form the via conductors 49 and 51. As the conductive paste used in printing or similar of the conductor patterns $48_1$, $48_2$, $50_1$, $50_2$ and the via conductors 49 and 51, a material comprising as the main component Ag, Pd, an alloy of these, or similar can be used.

Next, varistor green sheets which are to become the varistor layers $56_1$ to $56_{10}$ are prepared. These varistor green sheets are formed by using the doctor blade method to apply a slurry, the starting material of which comprises a prescribed amount of a mixed powder of for example ZnO, $Pr_{6011}$, CoO, $Cr_2O_3$, $CaCO_3$, $SiO_2$, $K_2CO_3$, and $Al_2O_3$, onto a film, such that the thickness is for example approximately 30 μm. No limitations in particular are placed on the starting-material powder of the slurry, so long as varistors of the prescribed composition result after integral firing, and crushed varistor powder obtained by advance prefiring of a varistor ceramic of prescribed composition may be used. However, the slurry does not contain a Cu component.

Next, a screen printing method or similar is used to form ground electrodes $58_1$ to $58_5$ and hot electrodes 60, 62, 64, 66 on varistor green sheets, employing conductive paste. As the conductive paste, a material comprising Ag, Pd, or an alloy of these as the main component can be used.

Next, intermediate member green sheets which are to become the intermediate layers $54_1$ and $54_2$ are prepared. Intermediate member green sheets are insulating members having electrically insulating properties, and are formed by for example using the doctor blade method to apply a slurry, the starting material of which is a mixed powder the main component of which is ZnO or $Fe_2O_3$, onto a film to a thickness of for example approximately 30 μm. The slurry does not contain a Cu component.

Next, the inductor green sheets on which conductor patterns in prescribed shapes $48_1$, $48_2$, $50_1$, $50_2$ and via conductors 49 and 51 are formed, inductor green sheets on which conductor patterns and via conductors are not formed, varistor green sheets on which hot electrodes 60, 62, 64, 66 are formed, varistor green sheets on which ground electrodes $58_1$ to $58_5$ are formed, varistor green sheets on which hot electrodes and ground electrodes are not formed, and intermediate member green sheets, are stacked in order as shown in FIG. 14 and pressed, after which cutting into chip units is performed to obtain a green multilayer body. Then firing is performed under prescribed conditions (for example, at 1100° C. to 1200° C. in an air atmosphere) to obtain the multilayer body CE5.

Next, conductive paste is applied to the end portions in the length direction and to the centers of both side faces in the length direction of the multilayer body CE5, and heat treatment is performed under prescribed conditions (for example, 700° C. to 800° C. in an air atmosphere), to bake the terminal electrodes. The conductive paste can comprise a powder the main component of which is Ag. Then, plating of the terminal electrode surfaces is performed, to obtain a multilayer electronic component E5 on which input terminal electrodes 34 and 36, output terminal electrodes 38 and 40, and a ground terminal electrode 42 are formed. It is preferable that electroplating be performed as the plating process; as the material used, for example Ni/Sn, Cu/Ni/Sn, Ni/Pd/Au, Ni/Pd/Ag, Ni/Ag, or similar can be used.

Thus by means of this invention, varistor layers $56_1$ to $56_{10}$ are formed from a slurry not containing a Cu component in a multilayer filter comprising an inductor portion forming a common-mode choke coil and a varistor portion comprising varistors. As a result, degradation of the attenuation characteristics in the varistor portion of the multilayer filter F5 does not readily occur. In the multilayer filter F5, the intermediate member green sheets are also formed from a slurry not containing a Cu component, and moreover the intermediate member green sheets are made sufficiently thick, so that the probability of diffusion of a Cu component into the varistor layers $56_1$ to $56_{10}$ during firing is suppressed. Hence degradation of the attenuation characteristics in the varistor portion of the multilayer filter F5 occurs less readily.

Further, by means of this embodiment, second layers $53_2$ and $53_3$ comprising nonmagnetic material are stacked on both sides of the first layer $53_1$ comprising the same nonmagnetic material in the first sintered member of the inductor stacked-layer portion 53. Hence the frequency band in which an adequate inductance value is obtained for the coil conductors 48 and 50 (coils 81 and 82) can be extended to high frequencies, and the multilayer electronic component E5 having an improved filter characteristics can be realized.

In the above, preferred embodiments of multilayer filters F5 and methods of manufacture of such filters have been explained; however, this invention is not limited to the above-described embodiments, and various modifications can be made.

For example, in the above embodiments the inductor layers $46_1$ to $46_4$ forming the first layer $53_1$ are nonmagnetic layers; but not all of the inductor layers $46_1$ to $46_4$ need be nonmagnetic. That is, it is sufficient that prescribed regions within each of the inductor layers $46_1$ to $46_4$ be nonmagnetic. More specifically, among the inductor layers $46_1$ to $46_4$, it is sufficient that at least the regions enclosed between the conductor patterns $48_1$ and $48_2$ and the conductor patterns $50_1$ and $50_2$, the regions positioned on the inside of the conductor patterns $48_1$ and $48_2$, and the regions positioned on the inside of the conductor patterns $50_1$ and $50_2$.

Further, in the above embodiments, the inductor layers $46_1$ to $46_4$ forming the first layer $53_1$ and the inductor layers $44_1$ to $44_7$ forming the second layers $53_2$ and $53_3$ are all nonmagnetic layers; but a configuration is possible in which the inductor layers $44_1$ to $44_7$ are magnetic layers and the inductor layers $46_1$ to $46_4$ are nonmagnetic layers. In this case, the second layers $53_2$ and $53_3$, of magnetic material, are stacked on both sides of the first layer $53_1$, of nonmagnetic material, so that the frequency band over which an adequate inductance value can be secured for the coil conductors 48 and 50 (coils 81 and 82) can be raised to a comparatively high frequency band. Hence a multilayer filter F5 with more excellent common-mode choke coil filter characteristics can be provided.

Further, any of the inductor layers $44_1$ to $44_7$ and $46_1$ to $46_4$ can be made magnetic layers. When magnetic layers are used, it is preferable that an Ni—Zn system ferrite or an Ni—Zn—Mg system ferrite be used as a ferrite material. In this case, the second layers $53_2$, of magnetic material, are stacked on both sides of the first layer $53_1$, of the same magnetic material, so that compared with a configuration in which the first layer $53_1$ is of nonmagnetic material and the second layers $53_2$ are of magnetic material, the inductance value of the coil conductors 48 and 50 (coils 81 and 82) at lower frequencies can be made higher. Hence a multilayer filter F5 with more excellent common-mode choke coil filter characteristics can be provided.

In the above embodiment, the number of coil conductors (coils) was two; but other numbers of coils are possible.

In the above, first to fifth embodiments have been explained; and an Example 1 and Comparative Examples 1 to 3 are employed to demonstrate in detail that degradation of attenuation characteristics can be suppressed through these embodiments. Attenuation characteristics utilize the phenomenon of resonance due to the inductance (L) and electrostatic capacitance (C); in Example 1 and Comparative Examples 1 to 3, amounts of change and the rate of change of the electrostatic capacitance, as a requisite condition of the attenuation characteristics, are determined.

In Example 1, a multilayer filter was used having the same configuration as the multilayer filter F1 of the first embodiment. In Comparative Examples 1 to 3, filters were used having substantially the same configuration as the multilayer filter F1, but with the Cu component content of the varistor layers corresponding to varistor layers $\mathbf{8}_2$ and $\mathbf{8}_3$ different from that in the multilayer filter F1. That is, in Comparative Example 1, a multilayer filter was used having a Cu component content in the varistor stacked-layer portion of 0.020 wt %; in Comparative Example 2, a multilayer filter was used having a Cu component content in the varistor stacked-layer portion of 0.012 wt %; and in Comparative Example 3, a multilayer filter was used having a Cu component content in the varistor stacked-layer portion of 0.003 wt %.

Figure 16:
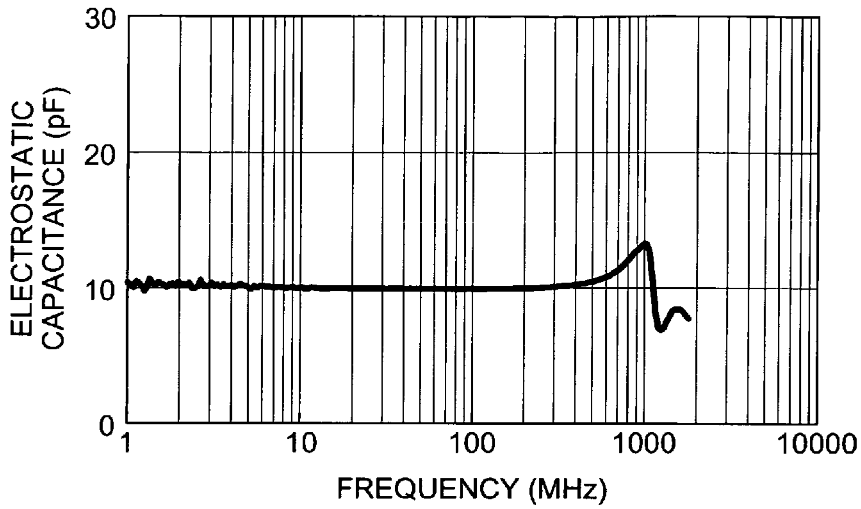
FIG. 16 is a graph showing the attenuation characteristic of the multilayer filter of Example 1.
Figure 16:
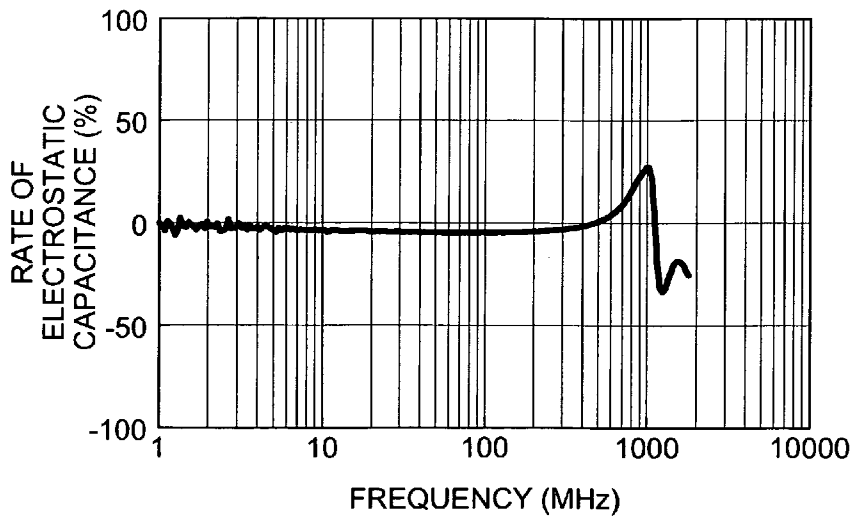
Figure 17:
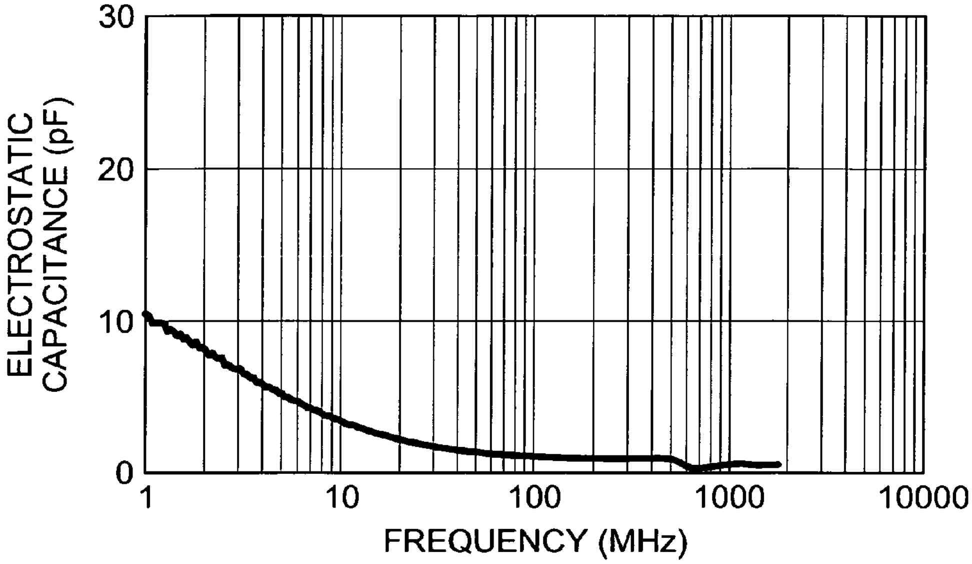
FIG. 17 is a graph showing the attenuation characteristic of the multilayer filter of Comparative Example 1.
Figure 17:
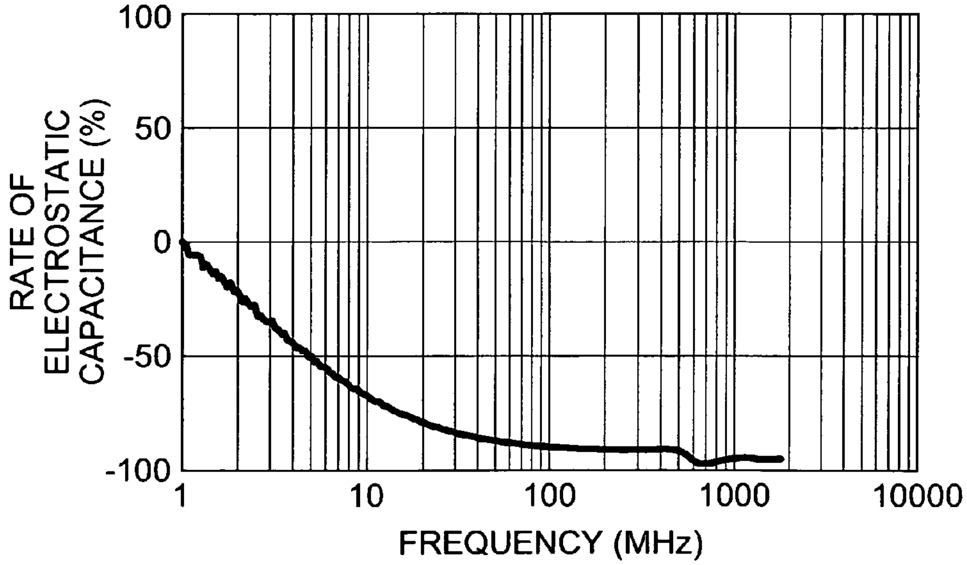
Figure 18:
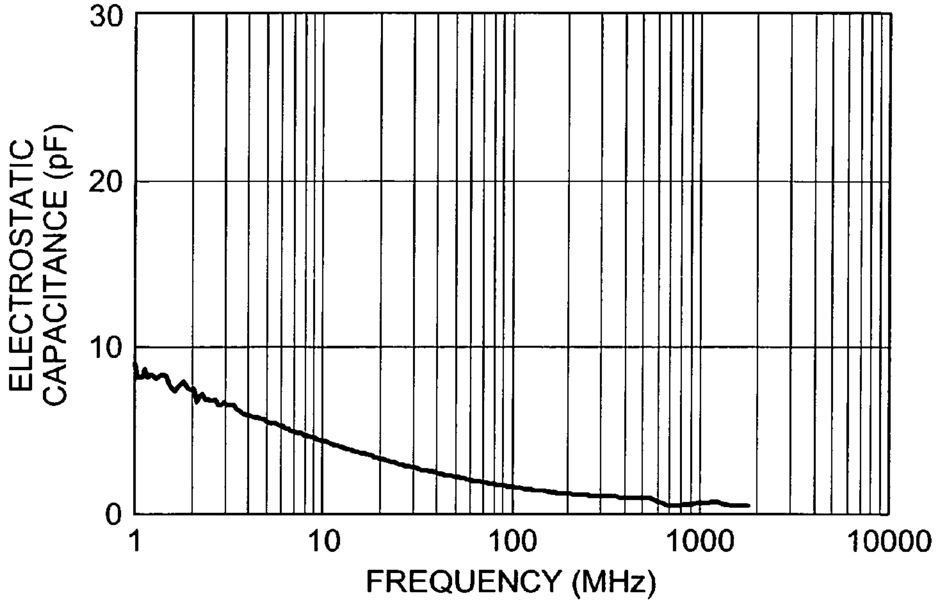
FIG. 18 is a graph showing the attenuation characteristic of the multilayer filter of Comparative Example 2; and, FIG. 19 is a graph showing the attenuation characteristic of the multilayer filter of Comparative Example 3.
Figure 18:
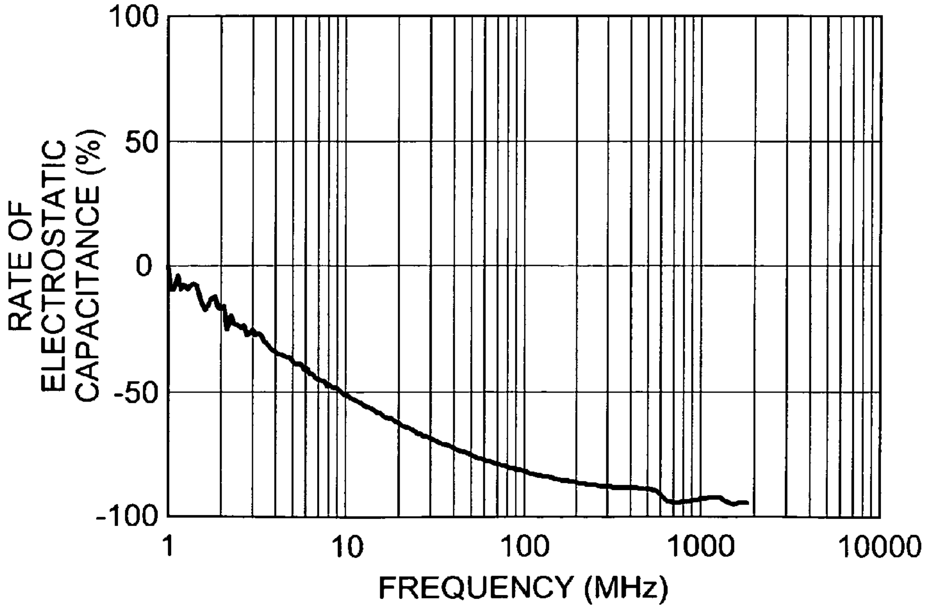
Figure 19:
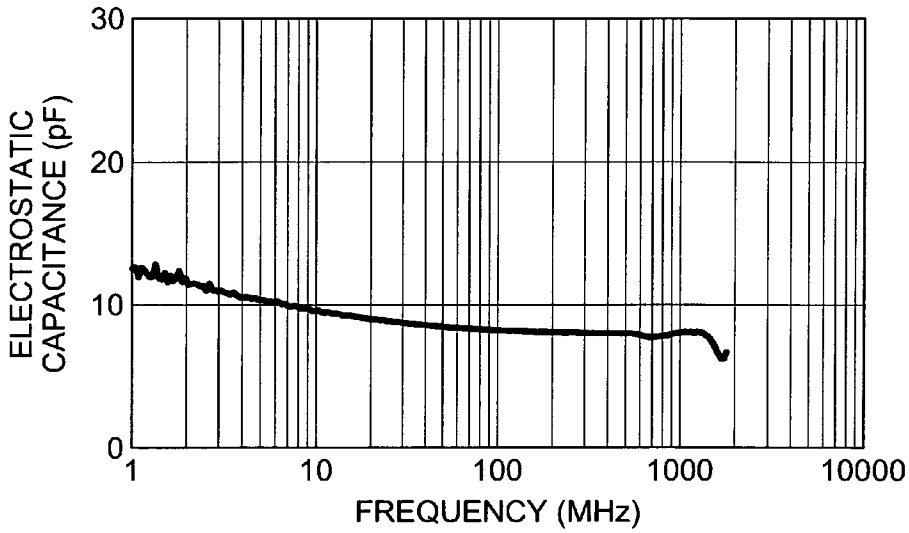
Figure 19:
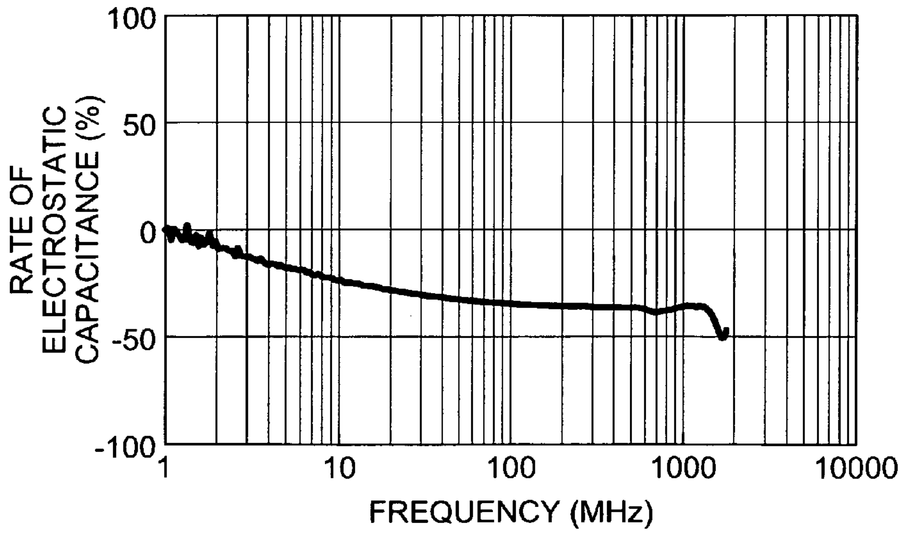

Attenuation characteristics of the multilayer filter of Example 1 appear in FIG. 16. Also, attenuation characteristics of the multilayer filter of Comparative Example 1 appear in FIG. 17, attenuation characteristics of the multilayer filter of Comparative Example 2 appear in FIG. 18, and attenuation characteristics of the multilayer filter of Comparative Example 3 appear in FIG. 19. Here (a) of FIG. 16, (a) of FIG. 17, (a) of FIG. 18, and (a) of FIG. 19 show amounts of change in the electrostatic capacitance in Example 1 and in Comparative Examples 1 to 3, while (b) of FIG. 16, (b) of FIG. 17, (b) of FIG. 18, and (b) of FIG. 19 show rates of change of the electrostatic capacitance in Example 1 and in Comparative Examples 1 to 3. As is clear from FIG. 16, an adequate electrostatic capacitance change is maintained in high-frequency bands in the case of the multilayer filter of Example 1. Hence the multilayer filter of Example 1 can be described as a multilayer filter with excellent attenuation characteristics in high-frequency bands. As is shown in FIG. 16, in the multilayer filter of Example 1, the electrostatic capacitance is substantially constant over the frequency range from 1 to 1000 MHz, but the electrostatic capacitance drops sharply when the frequency exceeds approximately 1000 MHz. That is, in the multilayer filter of Example 1, it can clearly be judged that the cutoff frequency is 1000 MHz. Hence by using this judgment, attenuation characteristics in high frequency bands can be designed. On the other hand as shown in FIG. 14 to FIG. 15, in the cases of the multilayer filters of Comparative Examples 1 to 3, the electrostatic capacitance falls with rising frequency even in the frequency range from 1 to 1000 MHz. That is, a cutoff frequency judgment cannot be utilized, so that it is difficult to design attenuation characteristics at high frequencies. The above serves to confirm the efficacy of this embodiment.

From the invention thus described, it will be obvious that the invention may be modified in many ways. Such modifications are not to be regarded as a departure from the spirit or scope of the invention, and all such modifications as would be obvious to one skilled in the art are intended for inclusion within the scope of the following claims.

What is claimed is:

1. A multilayer filter, comprising an inductor portion and a varistor portion, wherein the inductor portion has an inductor layer comprising a ferrite material and a Cu component, and an inductor conductor portion formed on the inductor layer, the varistor portion has a varistor layer comprising ZnO as a main component and not comprising a Cu component, and a plurality of varistor conductor portions arranged in opposition with the varistor layer intervening, the inductor portion and the varistor portion are stacked with an intermediate portion to prevent a diffusion of the Cu component contained in the inductor portion into the varistor portion, and the intermediate portion has a composition differing from that of the inductor portion and the varistor portion, and does not comprise a Cu component, and a region enclosed between opposing varistor conductor portions does not comprise a Cu component.

2. The multilayer filter according to claim 1, wherein the inductor layer comprises any one among an Ni—Zn system ferrite, an Ni—Zn—Mg system ferrite, and a Zn system ferrite as the ferrite material.

3. The multilayer filter according to claim 1, wherein the inductor portion is a common-mode choke coil having a sintered member and a plurality of coil conductors positioned within the sintered member.

4. The multilayer filter according to claim 3, wherein each of the coil conductors comprises a plurality of conductor patterns arranged in a first direction, the sintered member has a first layer enclosed between the conductor patterns in the first direction and second layers enclosing the plurality of the coil conductors in the first direction, and the first and second layers comprise a magnetic material.

5. The multilayer filter according to claim 3, wherein each of the coil conductors comprises a plurality of conductor patterns arranged in a first direction, the sintered member has a first layer enclosed between the conductor patterns in the first direction and second layers enclosing the plurality of the coil conductors in the first direction, and the first and second layers comprise a nonmagnetic material.

6. The multilayer filter according to claim 3, wherein each of the coil conductors comprises a plurality of conductor patterns arranged in a first direction, the sintered member has a first layer enclosed between the conductor patterns in the first direction and second layers enclosing the plurality of the coil conductors in the first direction, and the first layer comprises a nonmagnetic material while the second layers comprise a magnetic material.

* * * * *